United States Patent
Choi et al.

(10) Patent No.: US 11,532,951 B2
(45) Date of Patent: Dec. 20, 2022

(54) ELECTRONIC DEVICE INCLUDING RESONANT CHARGING CIRCUIT

(71) Applicant: Samsung Electronics Co., Ltd., Gyeonggi-do (KR)

(72) Inventors: Hangseok Choi, Gyeonggi-do (KR); Kisun Lee, Gyeonggi-do (KR)

(73) Assignee: Samsung Electronics Co., Ltd

(*) Notice: Subject to any disclaimer, the term of this patent is extended or adjusted under 35 U.S.C. 154(b) by 171 days.

(21) Appl. No.: 17/072,211

(22) Filed: Oct. 16, 2020

(65) Prior Publication Data

US 2021/0119487 A1 Apr. 22, 2021

(30) Foreign Application Priority Data

Oct. 17, 2019 (KR) .................. 10-2019-0129197
Apr. 24, 2020 (KR) .................. 10-2020-0050362

(51) Int. Cl.
*H02J 7/00* (2006.01)
*H02J 50/12* (2016.01)
*H03J 1/22* (2006.01)

(52) U.S. Cl.
CPC .......... *H02J 50/12* (2016.02); *H02J 7/00712* (2020.01); *H03J 1/22* (2013.01)

(58) Field of Classification Search
USPC .................. 320/106, 107, 108, 109, 110
See application file for complete search history.

(56) References Cited

U.S. PATENT DOCUMENTS

| | | | |
|---|---|---|---|
| 7,796,410 B2* | 9/2010 | Takayanagi | B60L 1/003 307/66 |
| 9,143,032 B2 | 9/2015 | Le et al. | |
| 9,555,714 B2 | 1/2017 | Tomura et al. | |
| 9,564,772 B2 | 2/2017 | Qiu et al. | |
| 9,780,663 B2 | 10/2017 | Lidsky et al. | |
| 9,866,039 B2 | 1/2018 | Adolf et al. | |

(Continued)

FOREIGN PATENT DOCUMENTS

| | | | |
|---|---|---|---|
| CN | 105934359 B * | 9/2017 | B60L 1/003 |
| KR | 1020200136594 | 12/2020 | |

(Continued)

OTHER PUBLICATIONS

International Search Report dated Feb. 8, 2021 issued in counterpart application No. PCT/KR2020/014181, 9 pages.

(Continued)

*Primary Examiner* — Brian Ngo
(74) *Attorney, Agent, or Firm* — The Farrell Law Firm, P.C.

(57) ABSTRACT

An electronic device is provided. The electronic device includes a battery and a power management module electrically connected to the battery and configured to manage a charging or a discharging of the battery. The power management module includes a first charging circuit configured to include a first switch group, a first capacitor, and a first inductor, a second charging circuit configured to include a second switch group, a second capacitor, and a second inductor, and a power path distributor configured to distribute power from a first external power supply device or a second external power supply device to the first charging circuit or the second charging circuit.

20 Claims, 20 Drawing Sheets

(56) References Cited

U.S. PATENT DOCUMENTS

| | | | |
|---|---|---|---|
| 9,954,436 B2* | 4/2018 | Khlat | H02M 3/07 |
| 10,063,139 B2 | 8/2018 | Le et al. | |
| 10,075,007 B2 | 9/2018 | Langltnais et al. | |
| 10,097,017 B2 | 10/2018 | Greening et al. | |
| 10,186,945 B1 | 1/2019 | Lidsky et al. | |
| 10,283,971 B2 | 5/2019 | Adolf et al. | |
| 10,389,246 B1 | 8/2019 | Lidsky et al. | |
| 10,447,057 B2 | 10/2019 | Yuan | |
| 10,468,963 B2 | 11/2019 | Lidsky et al. | |
| 10,523,039 B2 | 12/2019 | Melgar et al. | |
| 10,673,260 B2 | 6/2020 | Greening et al. | |
| 10,784,769 B2 | 9/2020 | Lidsky et al. | |
| 10,971,942 B2 | 4/2021 | Jung et al. | |
| 2012/0268063 A1 | 10/2012 | Qiu et al. | |
| 2014/0103860 A1* | 4/2014 | Kominami | H02M 1/32 320/108 |
| 2014/0306648 A1 | 10/2014 | Le et al. | |
| 2014/0306673 A1 | 10/2014 | Le et al. | |
| 2015/0303704 A1 | 10/2015 | Juan | |
| 2016/0129796 A1 | 5/2016 | Tomura et al. | |
| 2016/0261189 A1 | 9/2016 | Lidsky et al. | |
| 2016/0380455 A1 | 12/2016 | Greening et al. | |
| 2017/0133862 A1 | 5/2017 | Jung et al. | |
| 2017/0141583 A1 | 5/2017 | Adolf et al. | |
| 2018/0138718 A1 | 5/2018 | Adolf et al. | |
| 2018/0205235 A1 | 7/2018 | Yuan | |
| 2018/0248387 A1 | 8/2018 | Wang et al. | |
| 2019/0006933 A1 | 1/2019 | Lidsky et al. | |
| 2019/0013683 A1 | 1/2019 | Greening et al. | |
| 2019/0052113 A1 | 2/2019 | Melgar et al. | |
| 2019/0103766 A1 | 4/2019 | Novak, III et al. | |
| 2019/0115823 A1 | 4/2019 | Lidsky et al. | |
| 2019/0341849 A1 | 11/2019 | Lidsky et al. | |
| 2020/0112242 A1 | 4/2020 | Lidsky et al. | |
| 2020/0381994 A1 | 12/2020 | Choi et al. | |

FOREIGN PATENT DOCUMENTS

| | | |
|---|---|---|
| KR | 1020210045911 | 4/2021 |
| WO | WO-2019150597 A1 * | 8/2019 |

OTHER PUBLICATIONS

International Search Report dated Feb. 9, 2021 issued in counterpart application No. PCT/KR2020/014183, 10 pages.

U.S. Notice of Allowance dated Jun. 15, 2022 issued in counterpart U.S. Appl. No. 17/072,198, 21 pages.

European Search Report dated Sep. 23, 2022 issued in counterpart application No. 20877054.5-1202, 8 pages.

* cited by examiner

ELECTRONIC DEVICE INCLUDING RESONANT CHARGING CIRCUIT

CROSS-REFERENCE TO RELATED APPLICATION(S)

This application is based on and claims priority under 35 U.S.C. § 119 to Korean Patent Applications No. 10-2019-0129197, filed on Oct. 17, 2019 and 10-2020-0050362, filed on Apr. 24, 2020, in the Korean Intellectual Property Office, the entire disclosures of which are incorporated herein by reference.

BACKGROUND

1. Field

The present disclosure relates generally to an electronic device including a resonant charging circuit.

2. Description of Related Art

An electronic device such as a smartphone or a tablet personal computer (PC) may operate using power provided from a battery. A power management module (e.g., a power management integrated circuit (IC)(PMIC)) may transfer power provided from the battery to various components (e.g., a processor, a memory, or a communication chip) inside the electronic device.

The battery inside the electronic device may be charged through an external power source. Recently, various charging methods, wired or wireless, have been applied for fast charging. Among fast charging methods, a direct charging technology may allow an external power supply device (e.g., a power adapter) to control a constant voltage or a constant current for the battery inside the electronic device, and may simplify a charging circuit inside the electronic device. In addition, the direct charging technology may charge the battery with a high current while minimizing heat generation in the electronic device.

A conventional electronic device may support charging by the direct charging technology using a switched capacitor voltage divider (SCVD) circuit. Unlike general switching converters, the SCVD circuit may achieve high efficiency of about 96% or more to reduce heat generation of the electronic device, but may have a fixed voltage conversion ratio depending on the circuit configuration. Accordingly, a compatibility with various types of power devices or charging devices may be limited.

For example, when the SCVD circuit is connected to a legacy power adapter that supplies a fixed voltage of about 5 V or 9 V, because the SCVD circuit cannot perform the charging operation, a separate switching charger may have to be installed. As a result, a space for mounting components inside the electronic device may be reduced, and a cost of the electronic device may increase due to additional components.

In addition, to cope with both a wired power supply device and a wireless power supply device, a plurality of SCVD circuits and a plurality of switching chargers have to be installed, which further reduces the space for mounting components inside the electronic device.

SUMMARY

The present disclosure has been made to address at least the disadvantages described above and to provide at least the advantages described below.

In accordance with an aspect of the present disclosure, an electronic device is provided. The electronic device includes a battery and a power management module electrically connected to the battery and configured to manage a charging or a discharging of the battery. The power management module includes a first charging circuit configured to include a first switch group, a first capacitor, and a first inductor, a second charging circuit configured to include a second switch group, a second capacitor, and a second inductor, and a power path distributor configured to distribute power from a first external power supply device or a second external power supply device to the first charging circuit or the second charging circuit. The power management module is configured to identify a connection between the power path distributor and one of the first external power supply device or the second external power supply device, determine a type of the connected power supply device, when the type of the connected power supply device is a first type, allow the first charging circuit and the second charging circuit to operate in a first mode that allows the first charging circuit and the second charging circuit to each have a fixed voltage conversion ratio such that the battery is charged, and when the type of the connected power supply device is a second type, allow the first charging circuit and the second charging circuit to operate in a second mode that allows a voltage conversion ratio to be changed corresponding to a charging ratio of the battery such that the battery is charged.

BRIEF DESCRIPTION OF THE DRAWINGS

The above and other aspects, features and advantages of certain embodiments of the disclosure will be more apparent from the following detailed description taken in conjunction with the accompanying drawings, in which.

DETAILED DESCRIPTION

Figure 1:
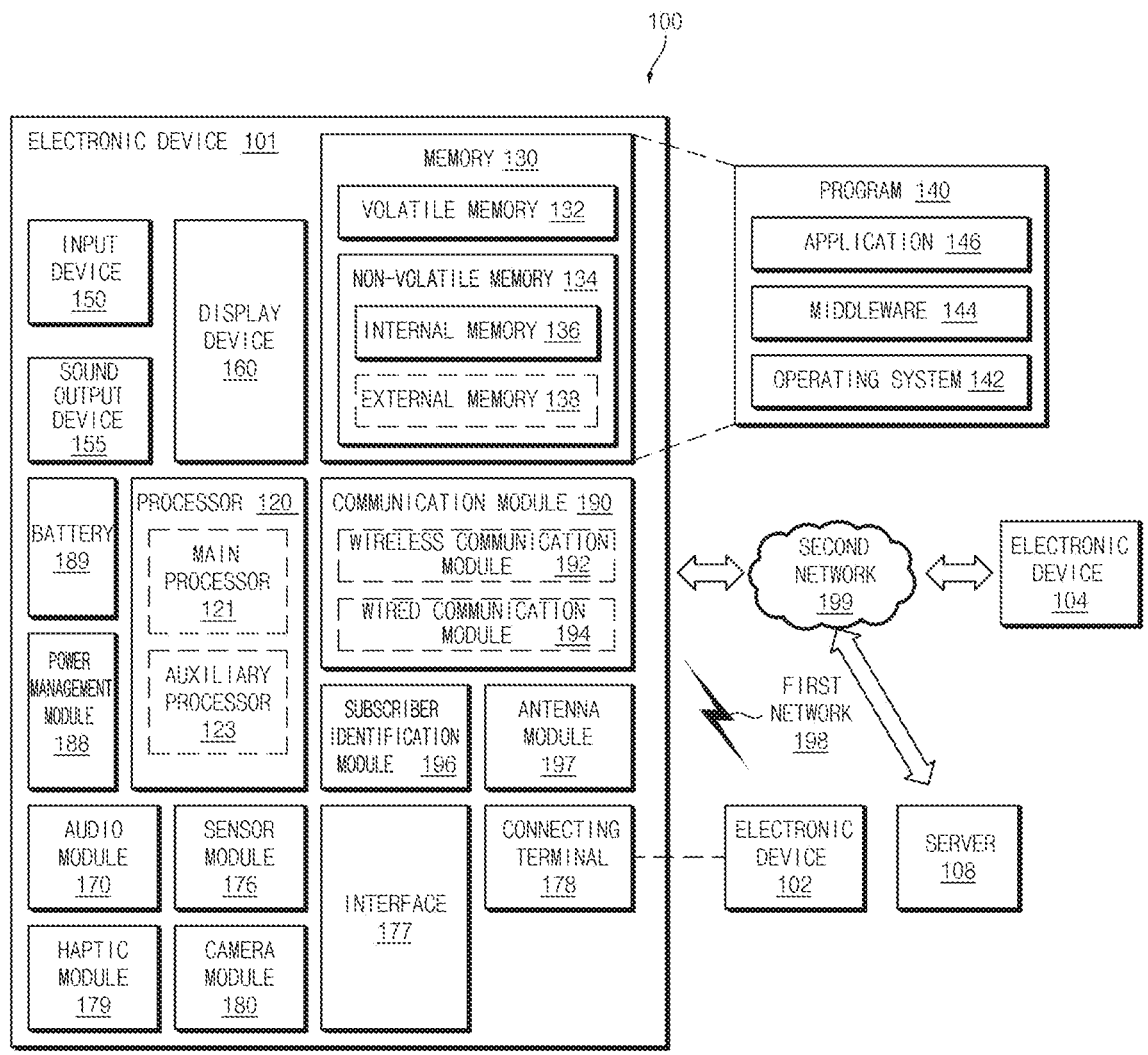
FIG. 1 is a diagram illustrating an electronic device in a network environment, according to various embodiments.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals.

FIG. 1 is a block diagram of an electronic device 101 in a network environment 100 according to various embodiments. An electronic device according to various embodiments of the present disclosure may include at least one of a smartphone, a tablet PC, a mobile phone, a video telephone, an electronic book reader, a desktop PC, a laptop PC, a netbook computer, a workstation, a server, personal digital assistant (PDA), a portable multimedia player (PMP), a Motion Picture Experts Group (MPEG-1 or MPEG-2) Audio Layer 3 (MP3) player, a mobile medical device, a camera, or a wearable device. According to various embodiments, a wearable device may include at least one of an accessory type of device (e.g., a timepiece, a ring, a bracelet, an anklet, a necklace, glasses, a contact lens, or a head-mounted device (HMD)), a one-piece fabric or clothes type of device (e.g., electronic clothes), a body-attached type of device (e.g., a skin pad or a tattoo), or a bio-implantable type of device (e.g., implantable circuit). According to various embodiments, the electronic device may include at least one of, for example, televisions (TVs), digital versatile disk (DVD) players, audios, audio accessory devices (e.g., speakers, headphones, or headsets), refrigerators, air conditioners, cleaners, ovens, microwave ovens, washing machines, air cleaners, set-top boxes, home automation control panels, security control panels, game consoles, electronic dictionaries, electronic keys, camcorders, or electronic picture frames.

In another embodiment, the electronic device may include at least one of navigation devices, satellite navigation system (e.g., Global Navigation Satellite System (GNSS)), event data recorders (EDRs) (e.g., black box for a car, a ship, or a plane), vehicle infotainment devices (e.g., head-up display for vehicle), industrial or home robots, drones, automatic teller's machines (ATMs), points of sales (POSs), measuring instruments (e.g., water meters, electricity meters, or gas meters), or internet of things (e.g., light bulbs, sprinkler devices, fire alarms, thermostats, or street lamps). The electronic device according to an embodiment of this disclosure may not be limited to the above-described devices, and may provide functions of a plurality of devices like smartphones which has measurement function of personal biometric information (e.g., heart rate or blood glucose). In this disclosure, the term "user" may refer to a person who uses an electronic device or may refer to a device (e.g., an artificial intelligence electronic device) that uses the electronic device.

The electronic device 101 may communicate with an electronic device 102 through a first network 198 (e.g., a short-range wireless communication network) or may communicate with an electronic device 104 or a server 108 through a second network 199 (e.g., a long-distance wireless communication network) in a network environment 100. According to an embodiment, the electronic device 101 may communicate with the electronic device 104 through the server 108. According to an embodiment, the electronic device 101 may include a processor 120, a memory 130, an input device 150, a sound output device 155, a display device 160, an audio module 170, a sensor module 176, an interface 177, a haptic module 179, a camera module 180, a power management module 188, a battery 189, a communication module 190, a subscriber identification module 196, or an antenna module 197. According to some embodiments, at least one (e.g., the display device 160 or the camera module 180) among components of the electronic device 101 may be omitted or one or more other components may be added to the electronic device 101. According to some embodiments, some of the above components may be implemented with one integrated circuit. For example, the sensor module 176 (e.g., a fingerprint sensor, an iris sensor, or an illuminance sensor) may be embedded in the display device 160 (e.g., a display).

The processor 120 may execute, for example, software (e.g., a program 140) to control at least one of other components (e.g., a hardware or software component) of the electronic device 101 connected to the processor 120 and may process or compute a variety of data. According to an embodiment, as a part of data processing or operation, the processor 120 may load a command set or data, which is received from other components (e.g., the sensor module 176 or the communication module 190), into a volatile memory 132, may process the command or data loaded into the volatile memory 132, and may store result data into a nonvolatile memory 134. According to an embodiment, the processor 120 may include a main processor 121 (e.g., a central processing unit (CPU) or an application processor (AP)) and an auxiliary processor 123 (e.g., a graphic processing device, an image signal processor, a sensor hub processor, or a communication processor), which operates independently from the main processor 121 or with the main processor 121. Additionally or alternatively, the auxiliary processor 123 may use less power than the main processor 121, or is specified to a designated function. The auxiliary processor 123 may be implemented separately from the main processor 121 or as a part thereof.

The auxiliary processor 123 may control, for example, at least some of functions or states associated with at least one component (e.g., the display device 160, the sensor module 176, or the communication module 190) among the components of the electronic device 101 instead of the main processor 121 while the main processor 121 is in an inactive (e.g., sleep) state or together with the main processor 121 while the main processor 121 is in an active (e.g., an application execution) state. According to an embodiment, the auxiliary processor 123 (e.g., the ISP or the CP) may be implemented as a part of another component (e.g., the camera module 180 or the communication module 190) that is functionally related to the auxiliary processor 123.

The memory 130 may store a variety of data used by at least one component (e.g., the processor 120 or the sensor module 176) of the electronic device 101. For example, data may include software (e.g., the program 140) and input data or output data with respect to commands associated with the software. The memory 130 may include the volatile memory 132 or the nonvolatile memory 134.

The program 140 may be stored in the memory 130 as software and may include, for example, a kernel 142, a middleware 144, or an application 146.

The input device 150 may receive a command or data, which is used for a component (e.g., the processor 120) of the electronic device 101, from an outside (e.g., a user) of the electronic device 101. The input device 150 may include, for example, a microphone, a mouse, a keyboard, or a digital pen (e.g., a stylus pen).

The sound output device 155 may output a sound signal to the outside of the electronic device 101. The sound output device 155 may include, for example, a speaker or a receiver. The speaker may be used for general purposes, such as multimedia play or recordings play, and the receiver may be used for receiving calls. According to an embodiment, the receiver and the speaker may be either integrally or separately implemented.

The display device 160 may visually provide information to the outside (e.g., the user) of the electronic device 101. For example, the display device 160 may include a display, a hologram device, or a projector and a control circuit for controlling a corresponding device. According to an embodiment, the display device 160 may include a touch circuitry configured to sense the touch or a sensor circuit (e.g., a pressure sensor) for measuring an intensity of pressure on the touch.

The audio module 170 may convert a sound and an electrical signal in dual directions. According to an embodiment, the audio module 170 may obtain the sound through the input device 150 or may output the sound through the sound output device 155 or an external electronic device (e.g., the electronic device 102 (e.g., a speaker or a headphone)) directly or wirelessly connected to the electronic device 101.

The sensor module 176 may generate an electrical signal or a data value corresponding to an operating state (e.g., power or temperature) inside or an environmental state (e.g., a user state) outside the electronic device 101. According to an embodiment, the sensor module 176 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 177 may support one or more designated protocols to allow the electronic device 101 to connect directly or wirelessly to the external electronic device (e.g., the electronic device 102). According to an embodiment, the interface 177 may include, for example, a high-definition multimedia interface (HDMI), a universal serial bus (USB) interface, a secure digital (SD) card interface, or an audio interface.

A connecting terminal 178 may include a connector that physically connects the electronic device 101 to the external electronic device (e.g., the electronic device 102). According to an embodiment, the connecting terminal 178 may include, for example, an HDMI connector, a USB connector, an SD card connector, or an audio connector (e.g., a headphone connector).

The haptic module 179 may convert an electrical signal to a mechanical stimulation (e.g., vibration or movement) or an electrical stimulation perceived by the user through tactile or kinesthetic sensations. According to an embodiment, the haptic module 179 may include, for example, a motor, a piezoelectric element, or an electric stimulator.

The camera module 180 may shoot a still image or a video image. According to an embodiment, the camera module 180 may include, for example, at least one or more lenses, image sensors, ISPs, or flashes.

The power management module 188 may manage power supplied to the electronic device 101. According to an embodiment, the power management module 188 may be implemented as at least a part of a PMIC.

The battery 189 may supply power to at least one component of the electronic device 101. According to an embodiment, the battery 189 may include, for example, a non-rechargeable (primary) battery, a rechargeable (secondary) battery, or a fuel cell.

The communication module 190 may establish a direct (e.g., wired) or wireless communication channel between the electronic device 101 and the external electronic device (e.g., the electronic device 102, the electronic device 104, or the server 108) and support communication execution through the established communication channel. The communication module 190 may include at least one CP operating independently from the processor 120 (e.g., the AP) and supporting the direct (e.g., wired) communication or the wireless communication. According to an embodiment, the communication module 190 may include a wireless communication module (or a wireless communication circuit) 192 (e.g., a cellular communication module, a short-range wireless communication module, or a global navigation satellite system (GNSS) communication module) or a wired communication module 194 (e.g., a local area network (LAN) communication module or a power line communication module). The corresponding communication module among the above communication modules may communicate with the external electronic device through the first network 198 (e.g., the short-range communication network such as a Bluetooth, a Wi-Fi direct, or an infrared data association (IrDA)) or the second network 199 (e.g., the long-distance wireless communication network such as a cellular network, an internet, or a computer network (e.g., LAN or wide area network (WAN))). The above-mentioned various communication modules may be implemented into one component (e.g., a single chip) or into separate components (e.g., chips), respectively. The wireless communication module 192 may identify and authenticate the electronic device 101 using user information (e.g., international mobile subscriber identity (IMSI)) stored in the subscriber identification module 196 in the communication network, such as the first network 198 or the second network 199.

The antenna module 197 may transmit or receive a signal or power to or from the outside (e.g., an external electronic device). According to an embodiment, the antenna module may include one antenna including a radiator made of a conductor or conductive pattern formed on a substrate (e.g., a PCB). According to an embodiment, the antenna module 197 may include a plurality of antennas. In this case, for example, the communication module 190 may select one antenna suitable for a communication method used in the communication network such as the first network 198 or the second network 199 from the plurality of antennas. The signal or power may be transmitted or received between the communication module 190 and the external electronic device through the selected one antenna. According to some embodiments, in addition to the radiator, other parts (e.g., a RFIC) may be further formed as a portion of the antenna module 197.

At least some components among the components may be connected to each other through a communication method (e.g., a bus, a general purpose input and output (GPIO), a serial peripheral interface (SPI), or a mobile industry processor interface (MIPI)) used between peripheral devices to exchange signals (e.g., a command or data) with each other.

According to an embodiment, the command or data may be transmitted or received between the electronic device 101 and the external electronic device 104 through the server 108 connected to the second network 199. Each of the electronic devices 101*a* and 101*b* may be the same or different types as or from the electronic device 101. According to an embodiment, all or some of the operations performed by the electronic device 101 may be performed by one or more external electronic devices among the external electronic devices 101*a*, 101*b*, or 103. For example, when the electronic device 101 performs some functions or services automatically or by request from a user or another device, the electronic device 101 may request one or more external electronic devices to perform at least some of the functions related to the functions or services, in addition to or instead of performing the functions or services by itself. The one or more external electronic devices receiving the request may carry out at least a part of the requested function or service or the additional function or service associated with the request and transmit the execution result to the electronic device 101. The electronic device 101 may provide the result as is or after additional processing as at least a part of the response to the request. To this end, for example, a cloud computing, distributed computing, or client-server computing technology may be used.

Figure 2:
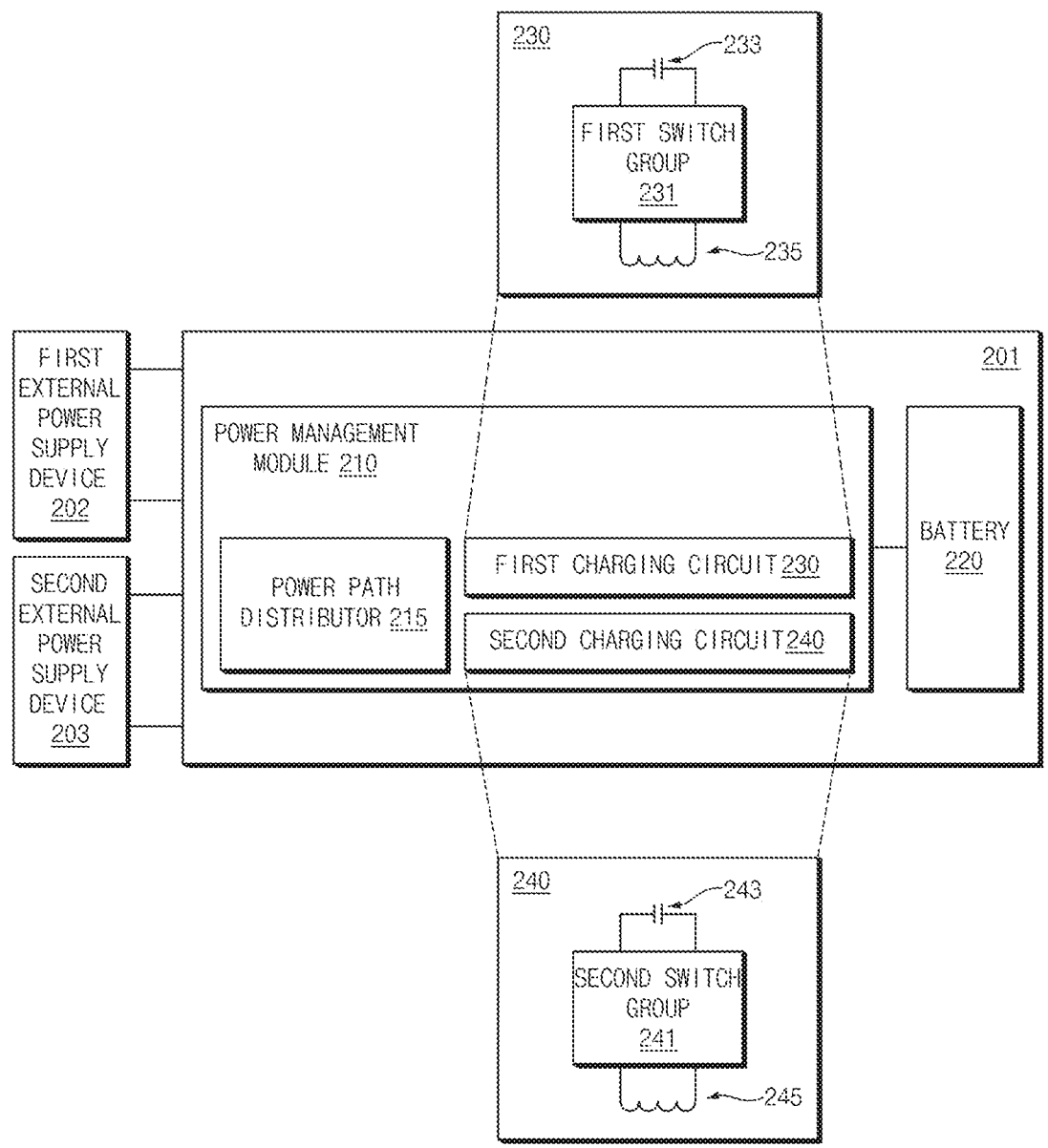
FIG. 2 is a block diagram illustrating a power management module and a battery, according to an embodiment.

FIG. 2 is a block diagram illustrating a power management module and a battery, according to an embodiment.

Referring to FIG. 2, an electronic device 201 may include a power management module 210 and a battery 220. The power management module 210 (e.g., a charger IC or a PMIC) may include a power path distributor 215, a first charging circuit 230, and/or a second charging circuit 240, and may control a flow of current output from the battery 220 and/or current flowing into the battery 220.

The power management module 210 may utilize power received from the battery 220 as a system supply source. The power management module 210 may supply power suitable for a voltage level that is required for each element inside the electronic device 201.

The power management module 210 may charge the battery 220 with power provided from a first external power supply device 202 or a second external power supply device 203. The first external power supply device 202 may be a fast charging power adapter, a travel adapter (TA), or a battery pack. The second external power supply device 203 may be a wireless power transmission device (e.g., a transmitter of a wireless charging system).

The power management module 210 may further include a separate operation element (or a controller) therein. An operation element (e.g., a logic circuit or a micro controller unit (MCU)) inside the power management module 210 may perform calculations and controls related to charging or discharging the battery 220. The operation element may control switches in the power path distributor 215, the first charging circuit 230, or the second charging circuit 240. The operation element may control switches in the power path distributor 215, the first charging circuit 230, or the second charging circuit 240 in response to a control signal provided by a processor inside the electronic device 201.

The power path distributor 215 may distribute power provided from the first external power supply device 202 or the second external power supply device 203 to the first charging circuit 230 and the second charging circuit 240. The first charging circuit 230 and the second charging circuit 240 may charge the battery 220 using the power provided through the power path distributor 215.

The first charging circuit 230 may include a first switch group 231, a first flying capacitor 233, and a first inductor 235. The first charging circuit 230 may operate as a voltage dividing circuit due to a resonance of the first flying capacitor 233 and the first inductor 235.

The second charging circuit 240 may include a second switch group 241, a second flying capacitor 243, and a second inductor 245. The second charging circuit 240 may operate as the voltage dividing circuit due to the resonance of the second flying capacitor 243 and the second inductor 245.

Figure 6A:
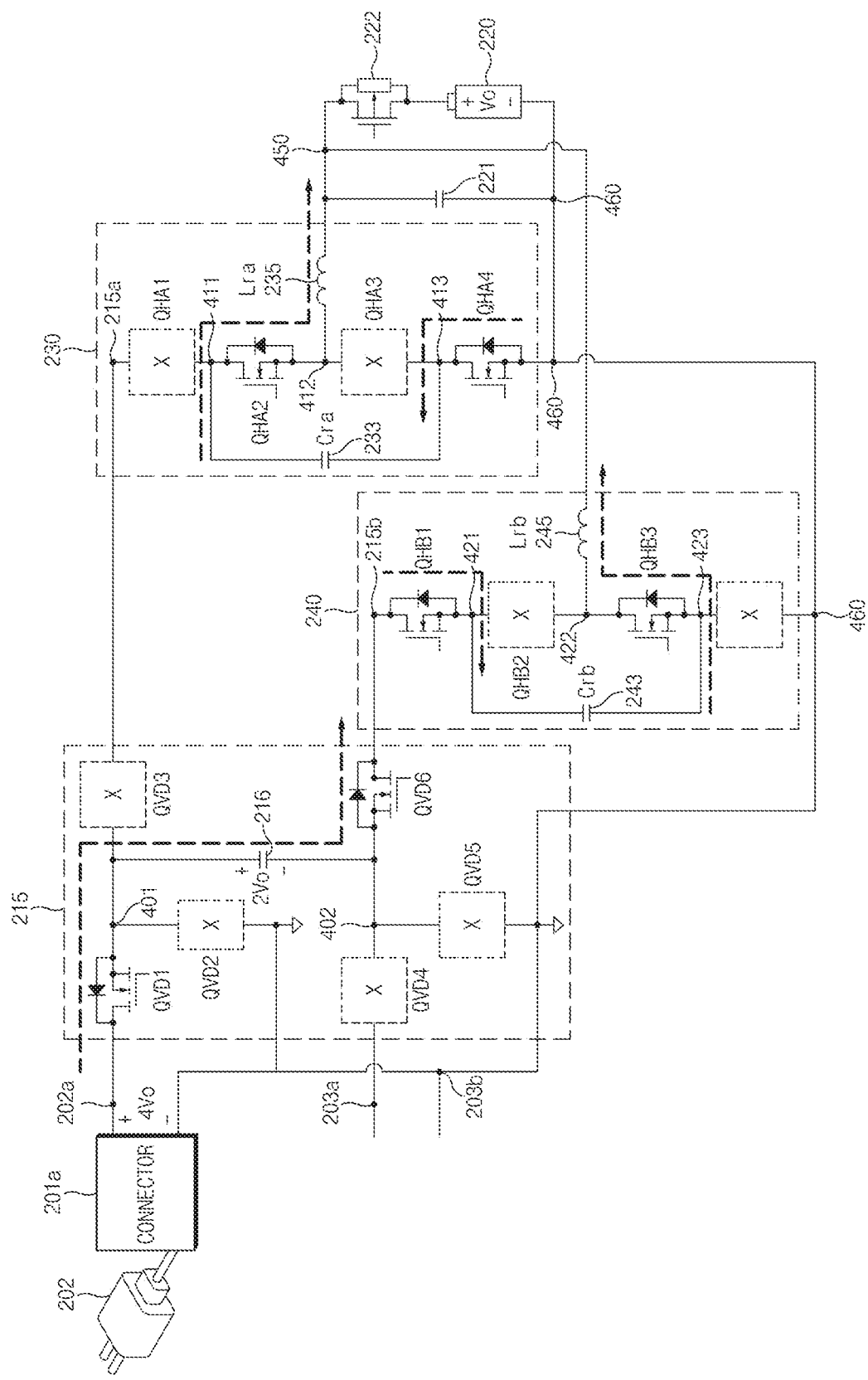
Figure 6B:
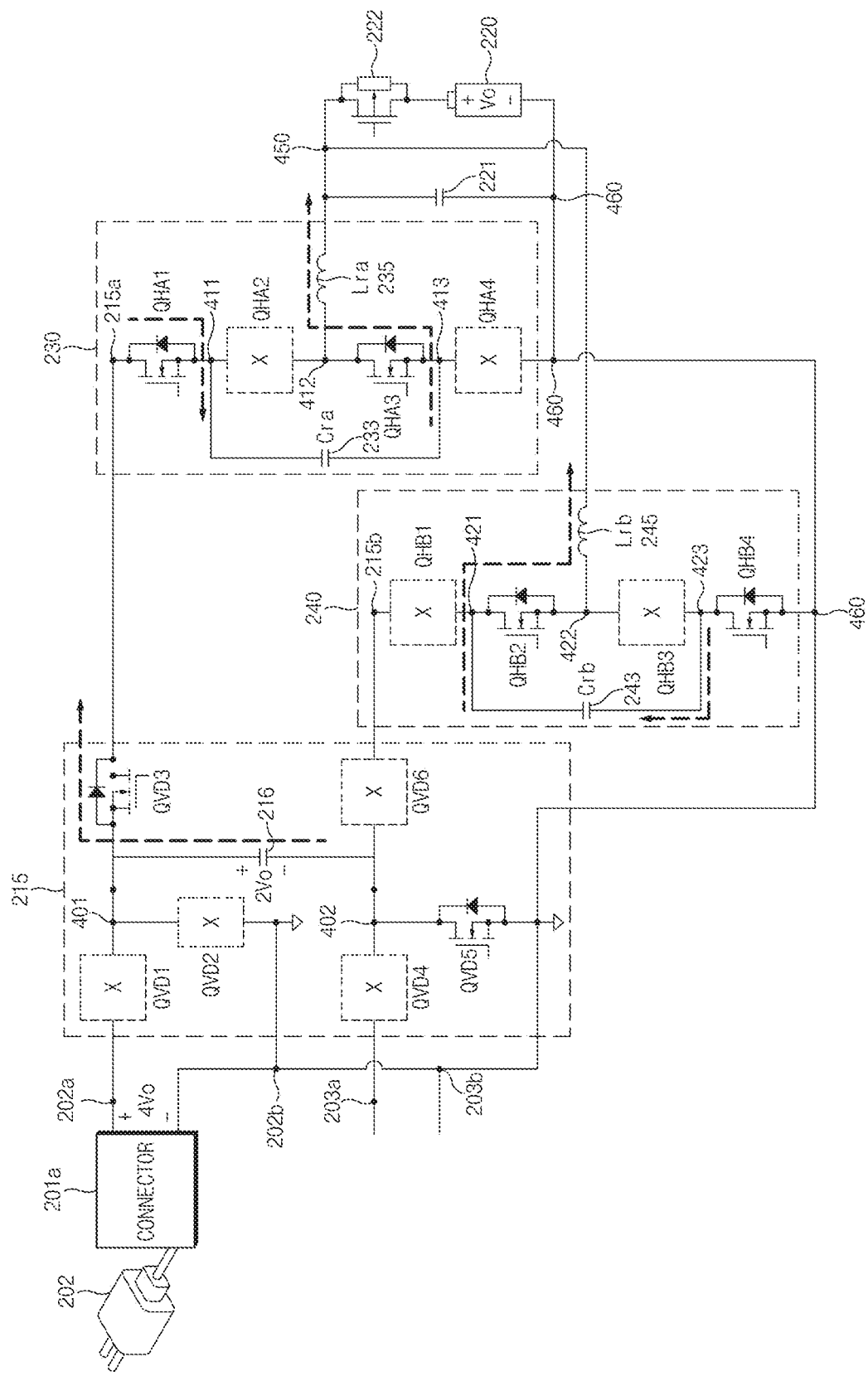

The power path distributor 215 may include a plurality of power distribution switches. The power path distributor 215 may control the plurality of power distribution switches such that the first charging circuit 230 and the second charging circuit 240 may operate in different modes. When the first charging circuit 230 operates in a mode in which the first flying capacitor 233 therein is discharged, the power path distributor 215 may allow the second charging circuit 240 to operate in a mode in which the second flying capacitor 243 is charged. When the first charging circuit 230 operates in a mode in which the first flying capacitor 233 is charged, the power path distributor 215 may allow the second charging circuit 240 to operate in a mode in which the second flying capacitor 243 is discharged (as shown in FIGS. 6A and 6B).

The first charging circuit 230 and the second charging circuit 240 may operate in different modes depending on a connection state of the first external power supply device 202 and/or the second external power supply device 203, or a type of the first external power supply device 202 and/or the second external power supply device 203. When one of the first external power supply device 202 or the second external power supply device 203 supports a direct charging or a fast charging (e.g., a quick charge) among the fast charging methods, each of the first charging circuit 230 and the second charging circuit 240 may operate in a first mode having a fixed voltage conversion ratio (e.g., about 2:1). The direct charging technology may be a charging method that allows the first external power supply device 202 (e.g., the power adapter) or the second external power supply device 203 to perform a constant voltage control or a constant current control for the battery 220 inside the electronic device 201. The first external power supply device 202 may transmit and receive a signal related to charging of the battery 220 with the electronic device 201 through a power delivery (PD) communication. The first external power supply device 202 or the second external power supply device 203 may perform the constant voltage control and the constant current control for charging the battery 220 using a programmable power supply (PPS) function of a USB PD 3.0. The second external power supply device 203 may be a wireless power transmission device, and a power supply part of the wireless power transmission device may transmit and receive a signal related to charging of the battery 220 with the electronic device 201 using an in-band communication (e.g., communication using a coil). The second external power supply device 203 may be connected to a TA for the fast charging, and a transmitter of the second external power supply device 203 may transmit and receive voltage information or current information regarding the direct charging with the electronic device 201 through the in-band communication (e.g., communication using the coil). The power supply part of the wireless power transmission device may perform the constant voltage control or the constant current control for charging the battery 220.

When both the first external power supply device 202 and the second external power supply device 203 are connected, the power management module 210 may allow connection of one power supply device and may block the connection of another power supply device. The power management module 210 may allow the first charging circuit 230 or the second charging circuit 240 to operate in the first mode or the second mode depending on characteristics of the connected power supply device. The power management module 210 may select and connect a power supply device capable of the PD communication, or may select and connect the first external power supply device 202 that is connected by wire.

When the first external power supply device 202 or the second external power supply device 203 supports the direct charging, the constant voltage control or the constant current control inside the first external power supply device 202 or the second external power supply device 203 is performed, and each of the first charging circuit 230 and the second charging circuit 240 may charge the battery 220 by lowering a voltage, based on the fixed voltage conversion ratio (e.g., about 2:1). In the first mode, the first charging circuit 230 and the second charging circuit 240 may operate with a relatively high charging efficiency (e.g., about 96% or more), and then the heat generation of the first charging circuit 230 and the second charging circuit 240 may be reduced. In addition, in the first mode, each of the first charging circuit 230 and the second charging circuit 240 may have a switching signal having a sine wave characteristic, and then a switching loss may be reduced.

In the first mode, the first charging circuit 230 and the second charging circuit 240 may alternately operate in different sub-modes. In the first period, the first charging circuit 230 may operate in a sub-mode (hereinafter, referred to as a discharge mode) in which the first flying capacitor 233 therein is discharged, and the second charging circuit 240 may operate in a sub-mode (hereinafter, referred to as a charge mode) in which the second flying capacitor 243 therein is charged. In a second period consecutive to the first period, the first flying capacitor 233 inside the first charging circuit 230 may operate in the charge mode, and the second flying capacitor 243 inside the second charging circuit 240 may operate in the discharge mode (as shown in FIGS. 6A and 6B).

When the first external power supply device 202 or the second external power supply device 203 is the legacy power adapter that does not support the direct charging, each of the first charging circuit 230 and the second charging circuit 240 may operate in the second mode in which a voltage conversion ratio is adjusted depending on a degree of charge of the battery 220. In the second mode, each of the first charging circuit 230 and the second charging circuit 240 may operate as a 3-level buck circuit in which the power conversion ratio is adjusted by a pulse width modulation (PWM) method. In the second mode, the first charging circuit 230 and the second charging circuit 240 may operate separately from each other depending on the degree of charge of the battery 220.

Figure 8:
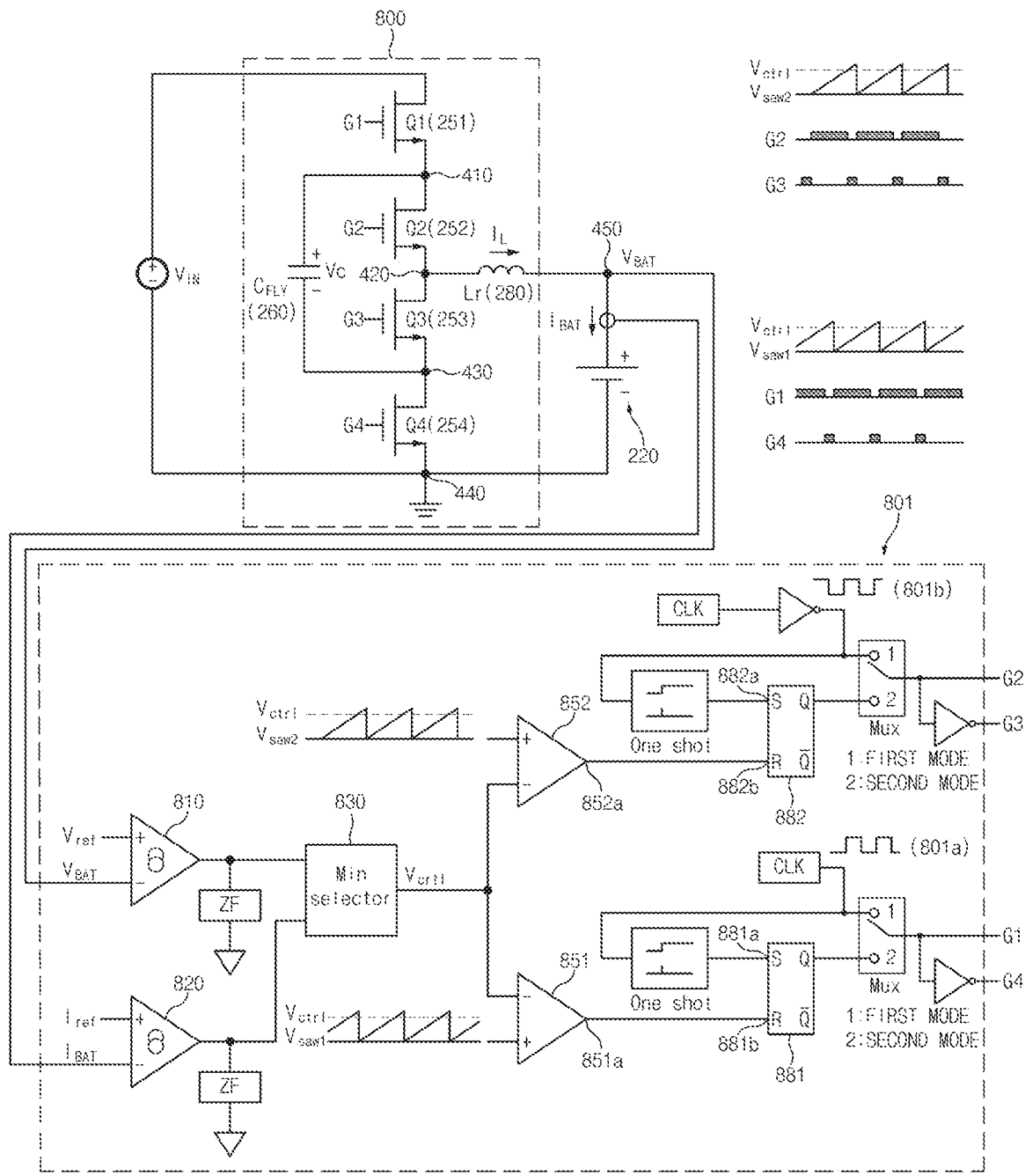
FIG. 8 is a diagram illustrating a switching control circuit of a voltage control method in a second mode, according to an embodiment.

In the second mode, a switching operation of the first switch group 231 of the first charging circuit 230 or the second switch group 241 of the second charging circuit 240 may be controlled based on the current flowing into the battery 220 or the voltage across both ends of the battery 220. The first flying capacitor 233 of the first charging circuit 230 may operate in one of a charge state, an idle state, or a discharge state, based on the switching of the first switch group 231. For another example, the second flying capacitor 243 of the second charging circuit 240 may operate in one of the charge state, the idle state, or the discharge state, based on a switching of the second switch group 241 (as shown in FIG. 8).

The battery 220 may be charged with electric power provided from the first external power supply device 202 or the second external power supply device 203. The battery 220 may supply power required for an operation of the electronic device 201. The battery 220 may include, for example, a lithium-ion battery or a rechargeable battery.

Figure 3:
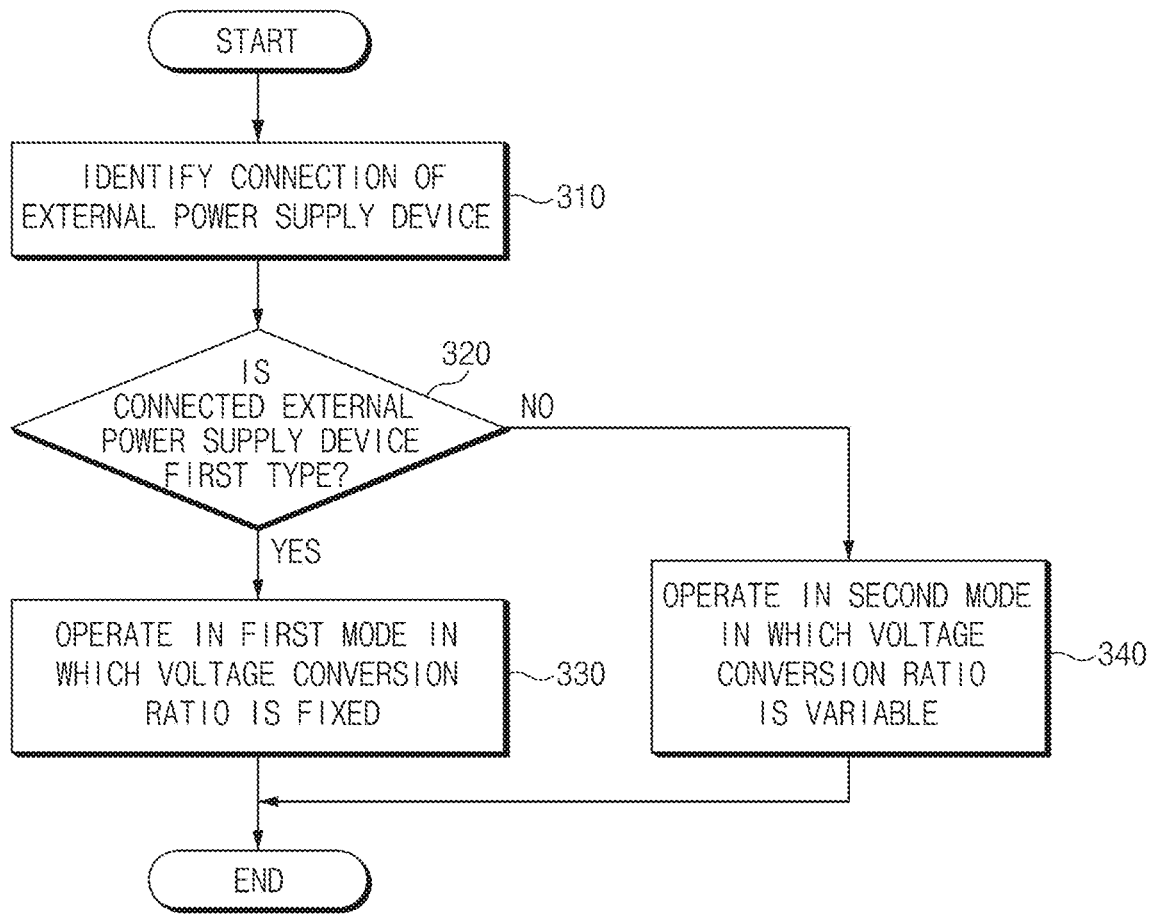
FIG. 3 is a flowchart describing a charging method depending on a type of an external power supply device, according to an embodiment.

FIG. 3 is a flowchart describing a charging method depending on a type of an external power supply device, according to an embodiment.

Referring to FIG. 3, at step 310, the power management module 210 of the electronic device 201 may identify a connection of an external power supply device (e.g., the first external power supply device 202 or the second external power supply device 203). The power management module 210 may receive power from one of the first external power supply device 202 or the second external power supply device 203.

When both the first external power supply device 202 and the second external power supply device 203 are connected, the power management module 210 may allow the connection of one power supply device and may block the connection of another power supply device. The power management module 210 may select and connect the power supply device capable of the PD communication, or may select and connect the first external power supply device 202 that is connected by wire.

At step 320, the power management module 210 may determine whether the connected power supply device among the first external power supply device 202 or the second external power supply device 203 is a first type of the power supply device (e.g., the power adapter) in which the constant voltage control or the constant current control for charging the battery 220 is performed in the first external power supply device 202 or the second external power supply device 203.

When the PD communication is possible with the connected power supply device (i.e., when the wireless power transmission device is connected, the power supply part of a wireless power supply device), the power management module 210 may determine that the connected power supply device is the first type of the power supply device. The power management module 210 may determine whether the connected power supply device is the first type of the power supply device by using the PPS function of the USB PD 3.0.

When the first type of the first external power supply device 202 is connected, the first external power supply device 202 may directly perform the PD communication with the electronic device 201. The second external power supply device 203 may be connected to the separate TA for fast charging, and the transmitter of the second external power supply device 203 may transmit and receive the voltage information or current information related to the direct charging with the electronic device 201 through the in-band communication (e.g., communication using the coil).

When the PD communication with the connected power supply device is not possible, the power management module 210 may determine that the connected power supply device is a second type of the power supply device (e.g., the legacy power adapter that does not support the direct charging). The second type of the first external power supply device 202 or the second external power supply device 203 may be a device that cannot perform the constant voltage control or the constant current control for the battery 220 inside the electronic device 201 and provides the fixed voltage. The second type of the power supply device may be the legacy power adapter or the wireless power transmission device (e.g., the transmitter of the wireless charging system) that supplies the fixed voltage of about 5 V or 9 V. The first charging circuit 230 or the second charging circuit 240 inside the electronic device 201 may change the voltage conversion ratio depending on the degree of charge of the battery 220.

At step 330, when the connected power supply device is the first type of the power supply device, the power management module 210 may allow each of the first charging circuit 230 and the second charging circuit 240 to operate in the first mode having the fixed voltage conversion ratio to perform the charging.

In the first mode, the voltage conversion ratio of each of the first charging circuit 230 and the second charging circuit 240 may be fixed to about 2:1. When a maximum current capacity of a standard USB type C cable is 3 A, the first type of the power supply device may supply power to the battery 220 while maintaining a maximum input current of about 3A or less. Each of the first charging circuit 230 and the second charging circuit 240 having the voltage conversion ratio of 2:1 drops the voltage of power transferred from the connected power supply device (e.g., the power adapter) by about ¼ and may transfer the current increased by about 4 times to the battery 220. Through this, while maintaining the maximum current capacity of the standard type C cable, it is possible to charge the battery 220 with a high power. In the first mode, the first charging circuit 230 and the second charging circuit 240 may obtain relatively high efficiency (e.g., about 96% or more) and may perform the fast charging while reducing the heat generation.

In the first mode, the first charging circuit 230 and the second charging circuit 240 may alternately operate in different sub-modes. In the first cycle, the first flying capacitor 233 inside the first charging circuit 230 may operate in the discharge mode, and the second flying capacitor 243 inside the second charging circuit 240 may operate in the charge mode. In the second period consecutive to the first period, the first flying capacitor 233 inside the first charging circuit 230 may operate in the charge mode, and the second flying capacitor 243 inside the second charging circuit 240 may operate in the discharge mode.

In the first mode, the power management module 210 may control a switch included in the first charging circuit 230 and the second charging circuit 240, based on a signal with a fixed first duty cycle (e.g., about 50%) and a first frequency (e.g., about 500 KHz). The first frequency may be set to the same value as a first resonant frequency of the first flying capacitor 233 and the first inductor 235. Alternatively, the first frequency may be set to the same value as a second resonant frequency of the second flying capacitor 243 and the second inductor 245. The first resonant frequency may be the same as the second resonant frequency.

The first charging circuit 230 may reduce a switching loss by a resonant operation of the first flying capacitor 233 and the first inductor 235. In addition, the second charging circuit 240 may reduce the switching loss by the resonant operation of the second flying capacitor 243 and the second inductor 245 (as shown in FIG. 5, 6A, 6B, or 7).

At step 340, when the connected first external power supply device 202 or the second external power supply device 203 is the second type of the power supply device (e.g., the legacy power adapter that does not support the direct charging), the power management module 210 may allow the first charging circuit 230 or the second charging circuit 240 to operate in the second mode in which the voltage conversion ratio is adjusted based on the charging ratio of the battery 220 and to perform the charging.

In the second mode, the power management module 210 may control a switch included in the first charging circuit 230 or the second charging circuit 240, based on a signal having a second duty cycle and a second frequency, which are varied by the PWM method. The second frequency may be the same as or similar to the first frequency of the first mode.

Figure 4:
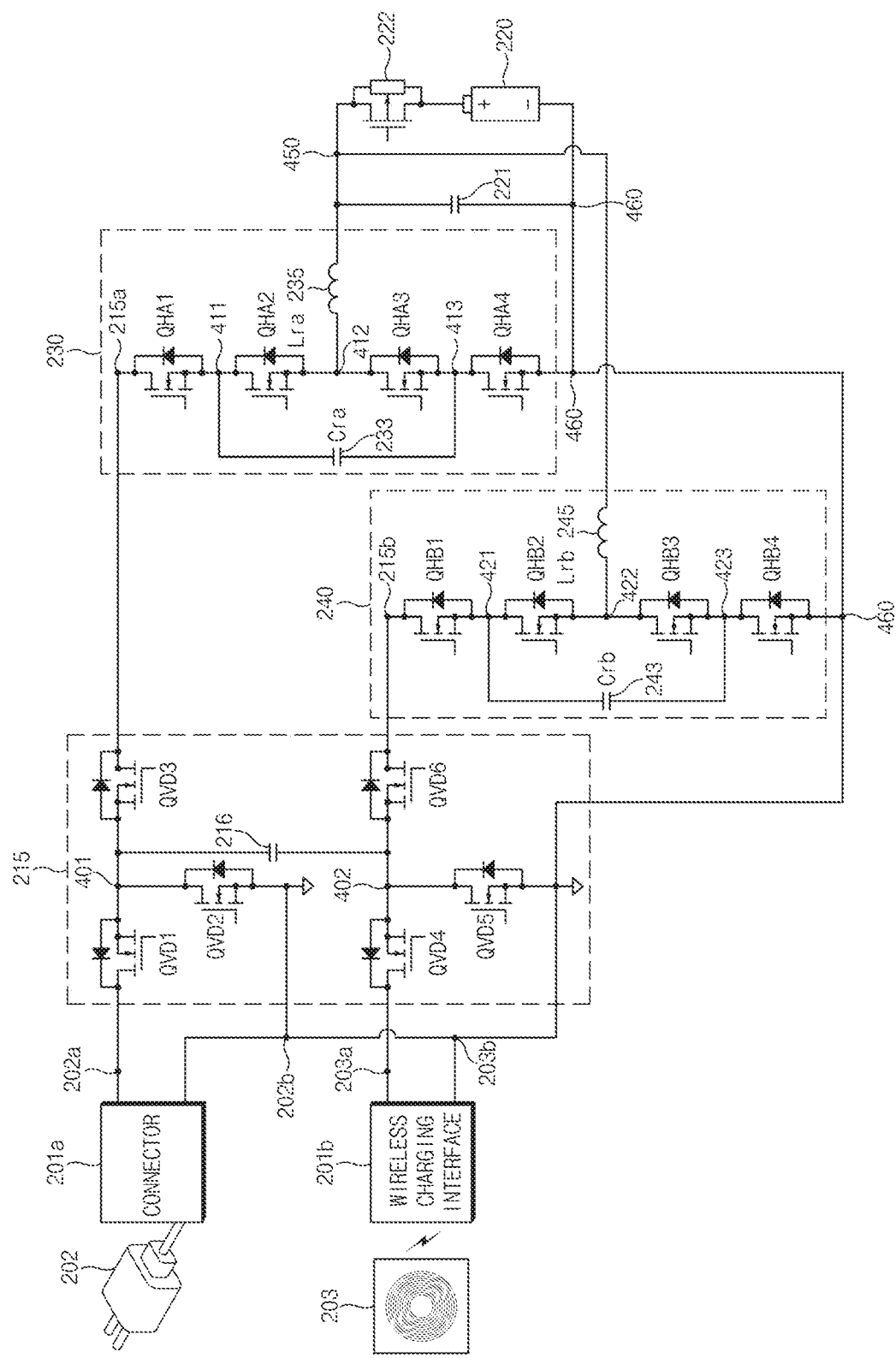
FIG. 4 is a diagram illustrating configurations of a power path distributor, a first charging circuit, and a second charging circuit, according to an embodiment.

FIG. 4 illustrates configurations of a power path distributor, a first charging circuit, and a second charging circuit, according to an embodiment. FIG. 4 is given as an example and is not limited thereto.

Referring to FIG. 4, the power path distributor 215 may distribute power provided from the first external power supply device 202 or the second external power supply device 203 to the first charging circuit 230 and the second charging circuit 240. When the first external power supply device 202 is connected to a connector (e.g., a USB port) 201a of the electronic device 201, the power path distributor 215 may distribute power provided through a first power terminal 202a to the first charging circuit 230 and the second charging circuit 240. When the second external power supply device 203 is connected to a wireless charging interface (e.g., a wireless charging coil and circuit) 201b of the electronic device 201, the power path distributor 215 may distribute power provided through a second power terminal 203a to the first charging circuit 230 and the second charging circuit 240.

The power path distributor 215 allows the first charging circuit 230 and the second charging circuit 240 to operate in different sub-modes through switching operation of first to sixth power distribution switches QVD1 to QVD6.

The power path distributor 215 may include the first to sixth power distribution switches QVD1 to QVD6 and a direct current (DC) blocking capacitor 216. The first power distribution switch QVD1 and the third power distribution switch QVD3 may be connected in series between the first power terminal 202a and an input node 215a of the first charging circuit 230. The second power distribution switch QVD2 may be connected between a first power node 401 of between the first power distribution switch QVD1 and the third power distribution switch QVD3 and a first ground terminal 202b. The fourth power distribution switch QVD4 and the sixth power distribution switch QVD6 may be connected in series between the second power terminal 203a and an input terminal 215b of the second charging circuit 240. The fifth power distribution switch QVD5 may be connected between a second power node 402 of between the fourth power distribution switch QVD4 and the sixth power distribution switch QVD6 and a second ground terminal 203b. The DC blocking capacitor 216 may be connected between the first power node 401 and the second power node 402.

The first charging circuit 230 may transfer power that is transferred from the first external power supply device 202 or the second external power supply device 203 to the battery 220.

The first charging circuit 230 may be configured as a first resonant type SCVD circuit. The first charging circuit 230 may include first to fourth switches QHA1 to QHA4, the first flying capacitor 233, and the first inductor 235.

The first to fourth switches QHA1 to QHA4 may be sequentially connected between the input node 215a of the first charging circuit 230 and a ground (or a second pole (e.g., −terminal) of the battery 220) 460. The first switch QHA1 may be electrically connected between the input node 215a of the first charging circuit 230 and a first node 411 of the first charging circuit 230. The second switch QHA2 may be electrically connected between the first node 411 and a second node 412 of the first charging circuit 230. The third switch QHA3 may be electrically connected between the second node 412 and a third node 413. The fourth switch QHA4 may be electrically connected between the third node 413 and the ground 460.

The first to fourth switches QHA1 to QHA4 of the first charging circuit 230 may operate under control of a controller inside the power management module 210 or a processor inside the electronic device 201.

The first flying capacitor 233 may be electrically connected between the first node 411 and the third node 413 of the first charging circuit 230. The first inductor 235 may be electrically connected between the second node 412 of between the second switch QHA2 and the third switch QHA3 and a first pole (e.g., +pole) 450 of the battery 220.

The first charging circuit 230 may operate in the first mode or the second mode depending on the type of the first external power supply device 202 or the second external power supply device 203. The first mode may be a mode operating at the fixed voltage conversion ratio, and the second mode may be a mode operating at the voltage conversion ratio that is changed depending on the charging state of the battery 220.

The second charging circuit 240 may transfer power transferred from the first external power supply device 202 or the second external power supply device 203 to the battery 220.

The second charging circuit 240 may be configured as a second resonant type SCVD circuit. The second charging circuit 240 may include first to fourth switches QHB1 to QHB4, the second flying capacitor 243, and the second inductor 245.

The first to fourth switches QHB1 to QHB4 may be sequentially connected. The first switch QHB1 may be electrically connected between the input terminal 215b of the second charging circuit 240 and a first node 421 of the second charging circuit 240. The second switch QHB2 may be electrically connected between the first node 421 and a second node 422 of the second charging circuit 240. The third switch QHB3 may be electrically connected between the second node 422 and a third node 423. The fourth switch QHB4 may be electrically connected between the third node 423 and the ground 460.

The first to fourth switches QHB1 to QHB4 of the second charging circuit 240 may operate under control of a controller inside the power management module 210 or a processor inside the electronic device 201.

The second flying capacitor 243 may be electrically connected between the first node 421 and the third node 423 of the second charging circuit 240. The second inductor 245 is electrically connected between the second node 422 between of the second switch QHB2 and the third switch QHB3 and the first pole (e.g., +pole) 450 of the battery 220.

The second charging circuit 240 may operate in the first mode or the second mode depending on the type of the first external power supply device 202 or the second external power supply device 203. The first mode may be a mode operating at the fixed voltage conversion ratio, and the second mode may be a mode operating at the voltage conversion ratio that is changed depending on the charging state of the battery 220.

A DC bypass capacitor 221 may be disposed between both ends of the battery 220. A control switch 222 for controlling charging may be added to the first pole (e.g., +pole) 450 of the battery 220.

FIGS. 5, 6A, 6B, and 7 illustrate an operation in a first mode of a first charging circuit and a second charging circuit, according to an embodiment.

Figure 5:
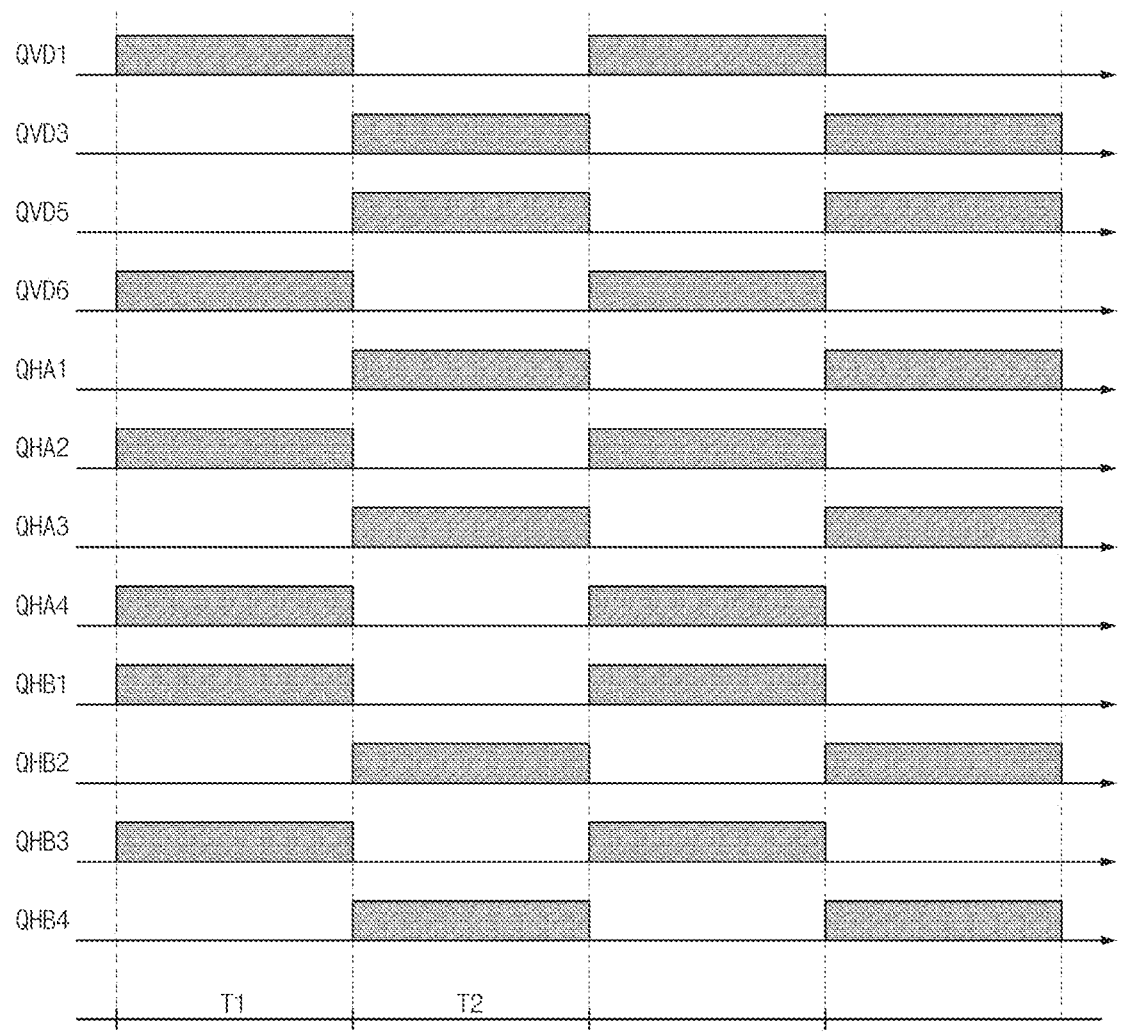
FIGS. 5, 6A, 6B, and 7 are diagrams illustrating an operation in a first mode of a first charging circuit and a second charging circuit, according to an embodiment.

Referring to FIGS. 5, 6A, and 6B, when one of the first external power supply device 202 or the second external power supply device 203 is connected, the power path distributor 215 may transfer power provided from the connected power supply device to the first charging circuit 230 and the second charging circuit 240.

When the first external power supply device 202 is connected and the second external power supply device 203 is not connected, the fourth power distribution switch QVD4 and the second power distribution switch QVD2 may maintain an OFF state. When the first external power supply device 202 is not connected and the second external power supply device 203 is connected, the first power distribution switch QVD1 and the fifth power distribution switch QVD5 may maintain the OFF state.

Hereinafter, a description will be given of a case in which the first external power supply device 202 is connected to the first charging circuit 230 and the second charging circuit 240, but the disclosure is not limited thereto. In addition, hereinafter, a description will be given of a case in which each of the first charging circuit 230 and the second charging circuit 240 has a voltage conversion ratio of 2:1 (e.g., switching with a 50% duty cycle), and an input voltage Vin of the first external power supply device 202 and a voltage Vo applied to the battery 220 have a ratio of 4:1, but the disclosure is not limited thereto.

Referring to FIG. 6A, when the first external power supply device 202 that maintains 4 times 4Vo of the voltage Vo applied to the battery 220 is connected, and the second external power supply device 203 is not connected, the fourth power distribution switch QVD4 and the second power distribution switch QVD2 may maintain the OFF state. The DC blocking capacitor 216 of the power path distributor 215 may be maintained at twice 2Vo of the voltage Vo applied to the battery 220.

When the connected first external power supply device 202 is of the first type, in a first period T1, the first power distribution switch QVD1 and the sixth power distribution switch QVD6 may be turned on. The first power terminal 202a and the input terminal 215b of the second charging circuit 240 may be conductive. Accordingly, twice 2Vo of the voltage Vo applied to the battery 220 may be applied to the input terminal 215b of the second charging circuit 240 by the DC blocking capacitor 216.

Referring to FIG. 5, in the first period T1, the first switch QHB1 and the third switch QHB3 may be turned on and the second switch QHB2 and the fourth switch QHB4 may be turned off among the first to fourth switches QHB1 to QHB4 of the second charging circuit 240. Accordingly, the second flying capacitor 243 may be charged by resonance (charge mode).

In contrast, in the first period T1, the second switch QHA2 and the fourth switch QHA4 may be turned on and the first switch QHA1 and the third switch QHA3 may be turned off among the first to fourth switches QHA1 to QHA4 of the first charging circuit 230. Accordingly, the first charging circuit 230 may charge the battery 220 by discharging the first flying capacitor 233 charged in a previous period of the first period T1 (discharge mode).

Referring to FIG. 6B, when the first external power supply device 202 is connected and the second external power supply device 203 is not connected, the fourth power distribution switch QVD4 and the second power distribution switch QVD2 may maintain the OFF state. The DC blocking capacitor 216 of the power path distributor 215 may be maintained at twice 2Vo of the voltage Vo applied to the battery 220.

When the connected first external power supply device 202 is of the first type, in the second period T2, the fifth power distribution switch QVD5 and the third power distribution switch QVD3 may be turned on. The first ground terminal 202b of the first external power supply device 202 and the input node 215a of the first charging circuit 230 may be electrically connected to each other. Accordingly, twice 2Vo of the voltage Vo applied to the battery 220 may be applied to the input node 215a of the first charging circuit 230 by the DC blocking capacitor 216.

Referring to FIG. 5, in the second period T2, the first switch QHA1 and the third switch QHA3 may be turned on and the second switch QHA2 and the fourth switch QHA4 may be turned off among the first to fourth switches QHA1 to QHA4 of the first charging circuit 230. Accordingly, the first flying capacitor 233 may be charged by resonance (charge mode).

In contrast, in the second period T2, the second switch QHB2 and the fourth switch QHB4 are turned on and the first switch QHB1 and the third switch QHB3 may be turned off among the first to fourth switches QHB1 to QHB4 of the second charging circuit 240. Accordingly, the second charging circuit 240 may charge the battery 220 by discharging the second flying capacitor 243 charged in the first period T1 prior to the second period T2 (discharge mode).

Figure 7:
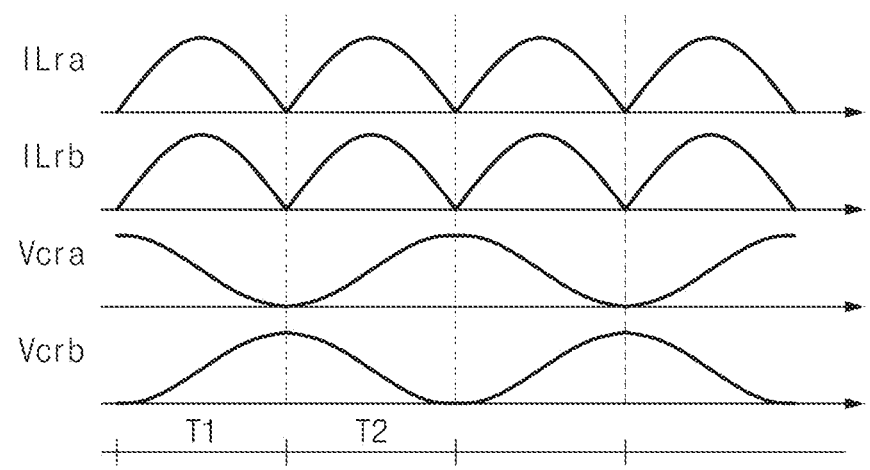

Referring to FIG. 7, in the first period T1, the first charging circuit 230 may charge the battery 220 by discharging the first flying capacitor 233 charged in the previous period of the first period T1 (discharge mode). The first flying capacitor 233 is discharged and may supply the current to the battery 220. The first charging circuit 230 may charge the battery 220 by discharging the power of the first flying capacitor 233 through the first inductor 235. A voltage Vcra across both ends of the first flying capacitor 233 may have a characteristic of a sine wave that gradually decreases.

In the first period T1, the second charging circuit 240 may charge the second flying capacitor 243 (charge mode). The second flying capacitor 243 is charged and may supply current to the battery 220. The voltage Vcrb across both ends of the second flying capacitor 243 may have a characteristic of a sine wave that gradually increases.

In the second period T2, the second charging circuit 240 may charge the battery 220 by discharging the second flying capacitor 243 charged in the first period T1 (discharge mode). The second flying capacitor 243 is discharged and may supply current to the battery 220. The second charging circuit 240 may charge the battery 220 by discharging the power of the second flying capacitor 243 through the second inductor 245. The voltage Vcrb across the both ends of the second flying capacitor 243 may have the characteristic of the sine wave that gradually decreases.

In the second period T2, the first charging circuit 230 may charge the first flying capacitor 233 (charge mode). The first flying capacitor 233 is charged and may supply current to the battery 220. The voltage Vcra across the both ends of the first flying capacitor 233 may have the characteristic of the sine wave that gradually increases.

FIG. 8 illustrates a switching control circuit of a voltage control method in a second mode, according to an embodiment. A charging circuit 800 in FIG. 8 may correspond to the first charging circuit 230 or the second charging circuit 240, which operates in the second mode.

In FIG. 4, when the first external power supply device 202, which is the legacy power adapter that does not support the direct charging, is connected and the second external power supply device 203 is not connected, the first power distribution switch QVD1, the third power distribution switch QVD3, and the fifth power distribution switch QVD5 may maintain an ON state. The second power distribution switch QVD2, the fourth power distribution switch QVD4, and the sixth power distribution switch QVD6 may maintain the OFF state. Through this, the input voltage Vin applied to the first power terminal 202a may be applied to the input node 215a of the first charging circuit 230. In this case, the charging circuit 800 may correspond to the first charging circuit 230 operating in the second mode.

In FIG. 4, when the second external power supply device 203, which is the wireless charging device that does not support the direct charging, is connected and the first external power supply device 202 is not connected, the second power distribution switch QVD2, the fourth power distribution switch QVD4, and the sixth power distribution switch QVD6 may maintain the ON state. The first power distribution switch QVD1, the third power distribution switch QVD3, and the fifth power distribution switch QVD5 may maintain the OFF state. Through this, the input voltage Vin applied to the second power terminal 203a may be applied to the input terminal 215b of the second charging circuit 240. In this case, the charging circuit 800 may correspond to the second charging circuit 240 operating in the second mode.

Referring to FIG. 8, in the second mode, the voltage conversion ratio of the charging circuit 800 may be adjusted depending on the degree of charge of the battery 220. In the second mode, the charging circuit 800 may operate as the 3-level buck circuit in which the power conversion ratio is adjusted by the PWM method. In the second mode, the charging circuit 800 may operate depending on the degree of charge of the battery 220.

In the second mode, a switching operation for a plurality of switches 251 to 254 of the charging circuit 800 (e.g., QHA1 to QHA4 or QHB1 to QHB4 in FIG. 4) may be controlled based on the current flowing into the battery 220 or the voltage across the both ends of the battery 220. A flying capacitor 260 (e.g., the first flying capacitor 233 or the second flying capacitor 243 of FIG. 4) of the charging circuit 800 may operate in one of the charge state, the idle state, and the discharge state, based on the switching of the plurality of switches 251 to 254.

The control circuit 801 in the power management module 210 may generate signals for controlling the first to fourth switches 251 to 254 of the charging circuit 230.

In the first mode, the control circuit 801 may generate the first control signal G1 for controlling the first switch, the second control signal G2 for controlling the second switch, the third control signal G3 for controlling the third switch, and the fourth control signal G4 controlling the fourth switch 254, based on a signal 801a of a clock generator CLK and an inverted signal 801b of the clock generator CLK.

In the first mode, the first control signal G1 may be the same as the third control signal G3, and the second control signal G2 may be the same as the fourth control signal G4. The second control signal G2 may have a phase opposite to that of the first control signal G1.

In the first mode, the first control signal G1 and the second control signal G2 may each have the fixed first duty cycle (e.g., about 50%) and the first frequency (e.g., about 500 kHz). The first frequency (e.g., about 500 kHz) may be set to the same value as the resonant frequency of the flying capacitor 260 and the inductor 280 of the output terminal.

In the second mode, the control circuit 801 may determine the duty control voltage $V_{ctrl}$, based on the voltage $V_{BAT}$ across the both ends of the battery 220 and the current $I_{BAT}$ flowing into the battery 220.

The control circuit 801 may amplify a voltage difference between the voltage $V_{BAT}$ across the both ends of the battery 220 and the set reference voltage $V_{ref}$ through a first error amplifier 810. The control circuit 801 may amplify a current difference between the current $I_{BAT}$ flowing into the battery 220 and the set reference current $I_{ref}$ through the second error amplifier 820. The control circuit 801 may compare an output of the first error amplifier 810 with an output of the second error amplifier 820 through a comparator 830, and may determine the duty control voltage $V_{ctrl}$, based on a relatively small output value. In FIG. 8, a case in which the duty control voltage $V_{ctrl}$ is determined by using both the voltage $V_{BAT}$ across the both ends of the battery 220 and the current $I_{BAT}$ flowing into the battery 220 is illustrated as an example, but the disclosure is not limited thereto. The duty control voltage $V_{ctrl}$ may be determined using one of the voltage $V_{BAT}$ across the both ends of the battery 220 and the current $I_{BAT}$ flowing into the battery 220.

In the second mode, the control circuit 801 may generate the first to fourth control signals G1 to G4 using the duty control voltage $V_{ctrl}$ and the first triangle wave $V_{saw1}$, or the duty control voltage $V_{ctrl}$ and the second triangle wave $V_{saw2}$.

The control circuit 801 may generate a first control signal G1 for controlling the first switch 251 by comparing the duty control voltage $V_{ctrl}$ with the first triangle wave $V_{saw1}$.

The control circuit 801 may change the first control signal G1 from a first state LOW to a second state HIGH in response to the clock signal CLK 801a. For example, the control circuit 801 may provide a toggling signal of the clock signal CLK to an S input 881a of a flip-flop 881. The control circuit 801 may allow the first control signal G1 to maintain the second state HIGH when the duty control voltage $V_{ctrl}$ is greater than the first triangle wave $V_{saw1}$.

The control circuit 801 may change the first control signal G1 from the second state HIGH to the first state LOW when the duty control voltage $V_{ctrl}$ is less than the first triangle wave $V_{saw1}$. The control circuit 801 may provide a signal from an output terminal 851a of a coupler 851 that couples the duty control voltage $V_{ctrl}$ and the first triangle wave $V_{saw1}$ to an R input 881b of the flip-flop 881.

The control circuit 801 may generate the second control signal G2 for controlling the second switch 252 by comparing the duty control voltage $V_{ctrl}$ with the second triangle wave $V_{saw2}$. The second triangle wave $V_{saw2}$ may be a signal in which the first triangle wave $V_{saw1}$ is shifted by half a period.

The control circuit 801 may change the second control signal G2 from the first state LOW to the second state HIGH in response to an inverted signal 801b of the clock signal CLK. The control circuit 801 may provide the inverted signal 801b of the clock signal CLK to an S input 882a of a flip-flop 882. The control circuit 801 may allow the second control signal G2 to maintain the second state HIGH when the duty control voltage $V_{ctrl}$ is greater than the second triangle wave $V_{saw2}$.

When the duty control voltage $V_{ctrl}$ is less than the second triangle wave $V_{saw2}$, the control circuit 801 may change the second control signal G2 from the second state HIGH to the first state LOW. The control circuit 801 may provide a signal from an output terminal 852a of a coupler 852 that couples the duty control voltage $V_{ctrl}$ and the second triangle wave $V_{saw2}$ to an R input 882b of the flip-flop 882.

The control circuit 801 may generate the fourth control signal G4 by inverting a phase of the first control signal G1. The control circuit 801 may generate the third control signal G3 by inverting a phase of the second control signal G2.

Figure 9:
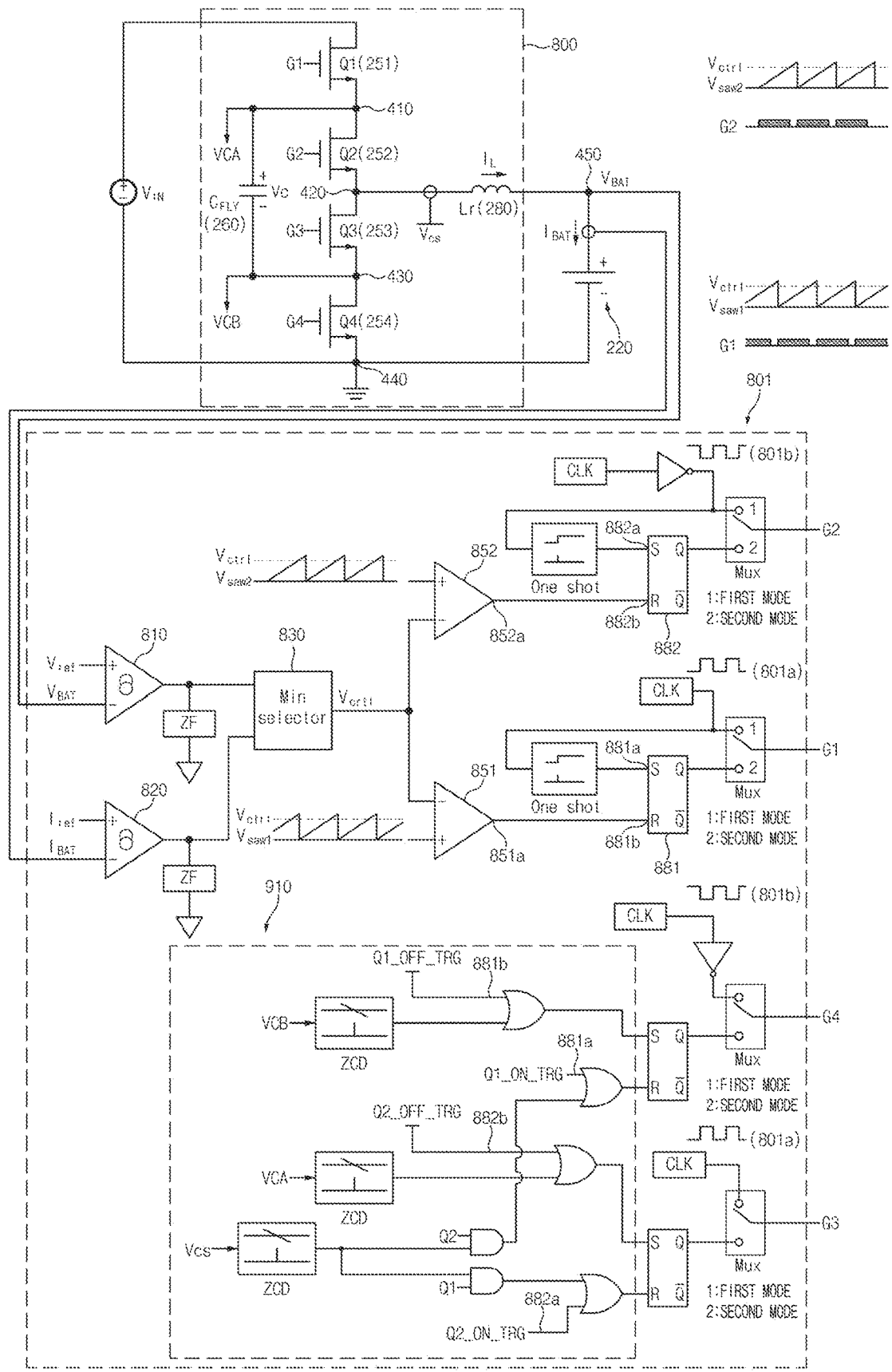
FIG. 9 is a diagram illustrating a control circuit that additionally uses a voltage across both ends of a flying capacitor, according to an embodiment.

FIG. 9 illustrates a control circuit that additionally uses a voltage across both ends of a flying capacitor, according to an embodiment.

Referring to FIG. 9, the control circuit 801 may include a voltage detector 910. The voltage detector 910 may have a simple circuit structure and thus may be easily implemented.

The voltage detector 910 may control the switching operation of the third switch 253 or the fourth switch 254 by using a voltage Vc across the both ends of the flying capacitor 260. The voltage detector 910 may adjust a turn-on timing of the third switch 253 or a turn-on timing of the fourth switch 254, depending on whether the voltage Vc across the both ends of the flying capacitor 260 is clamped to a ground voltage 0V or the input voltage $V_{IN}$.

Figure 12:
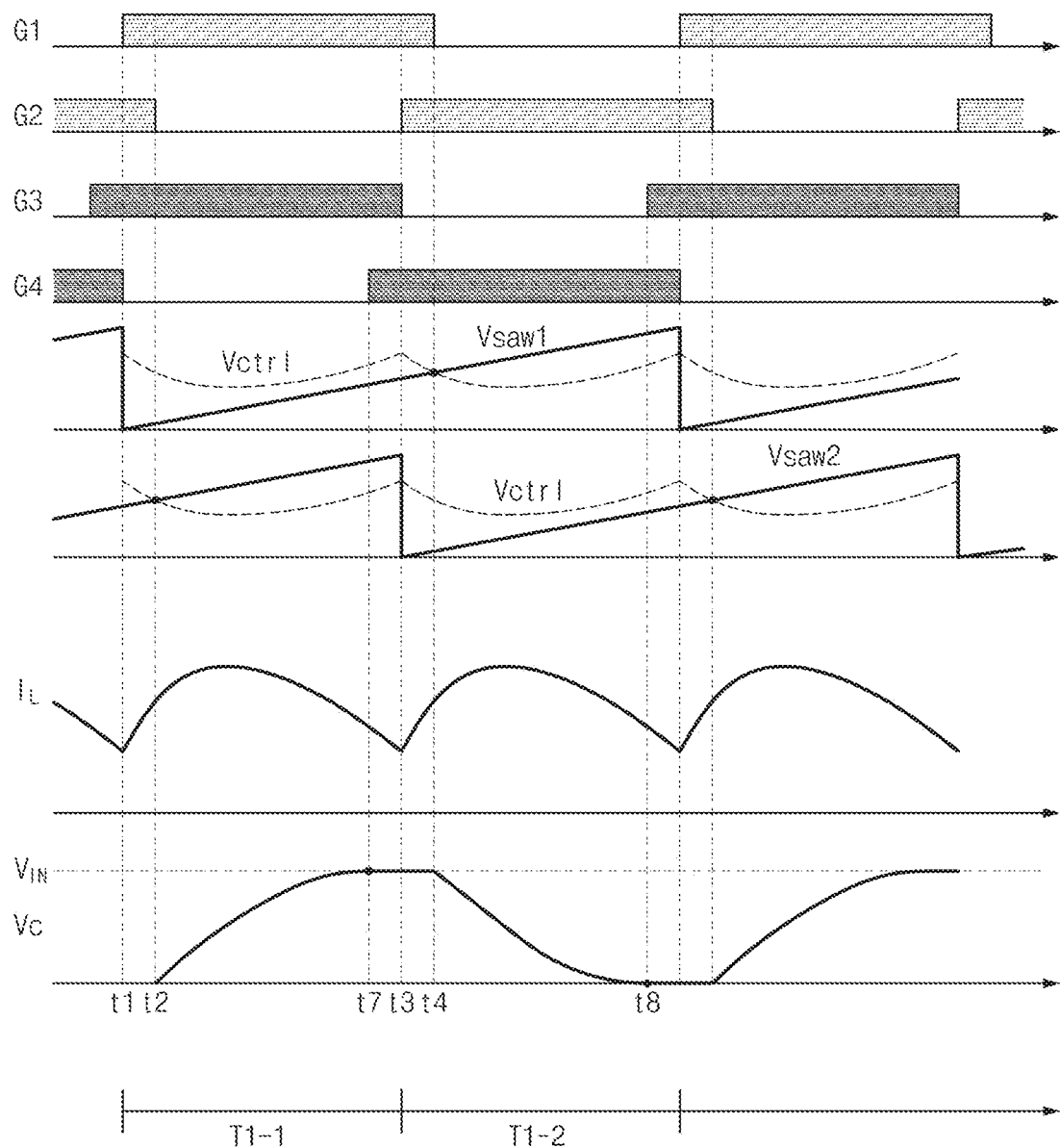
FIG. 12 illustrates a change in a switching signal of a voltage control method in a third state of a second mode, according to an embodiment.

A turn-on time of the third switch 253 may be determined by a relatively faster one of a time point at which the voltage VCA of the first node 410 crosses to '0' (or a time point at which the voltage Vc across the both ends of the flying capacitor 260 is clamped to the ground voltage) and a time point at which the second switch 252 is turned off (e.g., a time point at which a signal is provided to the R input 882b of the flip-flop 882) (as shown in FIG. 12).

A turn-on time of the fourth switch 254 may be determined by a relatively faster one of a time point at which the voltage VCB of the third node 430 crosses to '0' (or a time point at which the voltage Vc across the both ends of the flying capacitor 260 is clamped to the input voltage $V_{IN}$) and a time point at which the first switch 251 is turned off (e.g., a time point at which a signal is provided to the R input 881b of the flip-flop 881) (as shown in FIG. 12).

The voltage detector 910 may control the switching operation of the third switch 253 or the fourth switch 254 by using a time point at which when a current flowing through the inductor 280 (hereinafter, an inductor current $I_L$) (or a sensing voltage Vcs proportional to the inductor current $I_L$) becomes '0'.

Figure 11:
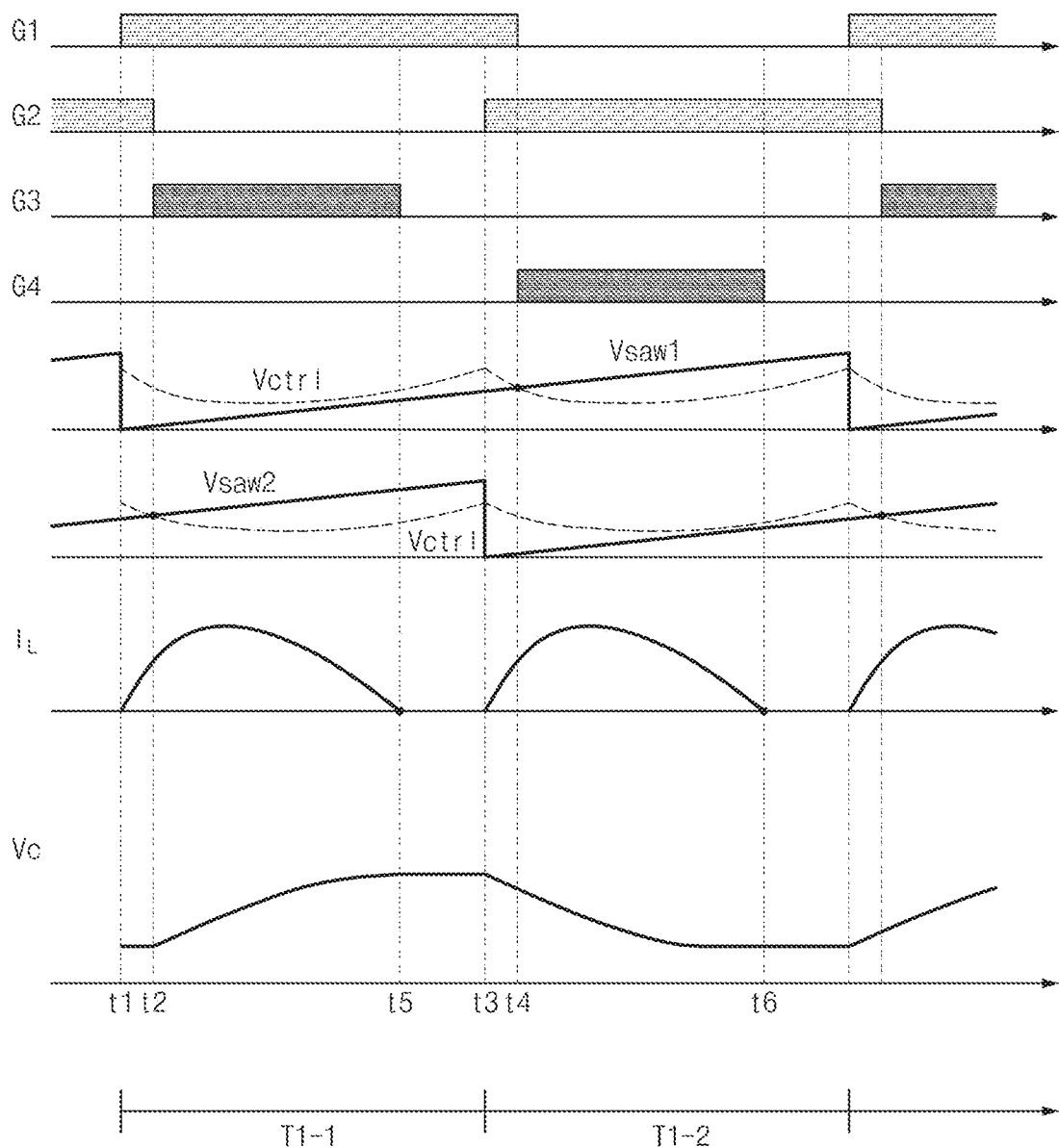
FIG. 11 illustrates a change in a switching signal of a voltage control method in a second state of a second mode, according to an embodiment.

A turn-off time of the third switch 253 may be determined by a relatively faster one of a time point at which the second switch 252 is turned on (e.g., a time point at which a signal is provided to the S input 882a of the flip-flop 882) and a time point at which the inductor current $I_L$ becomes '0' (or a time point at which the sensing voltage Vcs crosses to '0') while the first switch 251 is conducting (turned on). Through this, it is possible to prevent the inductor current $I_L$ from falling below '0' (as shown in FIG. 11).

A turn-off time of the fourth switch 254 may be determined by a relatively faster one of a time point at which the first switch 251 is turned on (e.g., a time point at which a signal is provided to the S input 881a of the flip-flop 881) and a time point at which the inductor current $I_L$ becomes '0' (or a time point at which the sensing voltage Vcs crosses to '0') while the second switch 252 is conducting (turned on). Through this, it is possible to prevent the inductor current $I_L$ from falling below '0' (as shown in FIG. 11).

Figure 10:
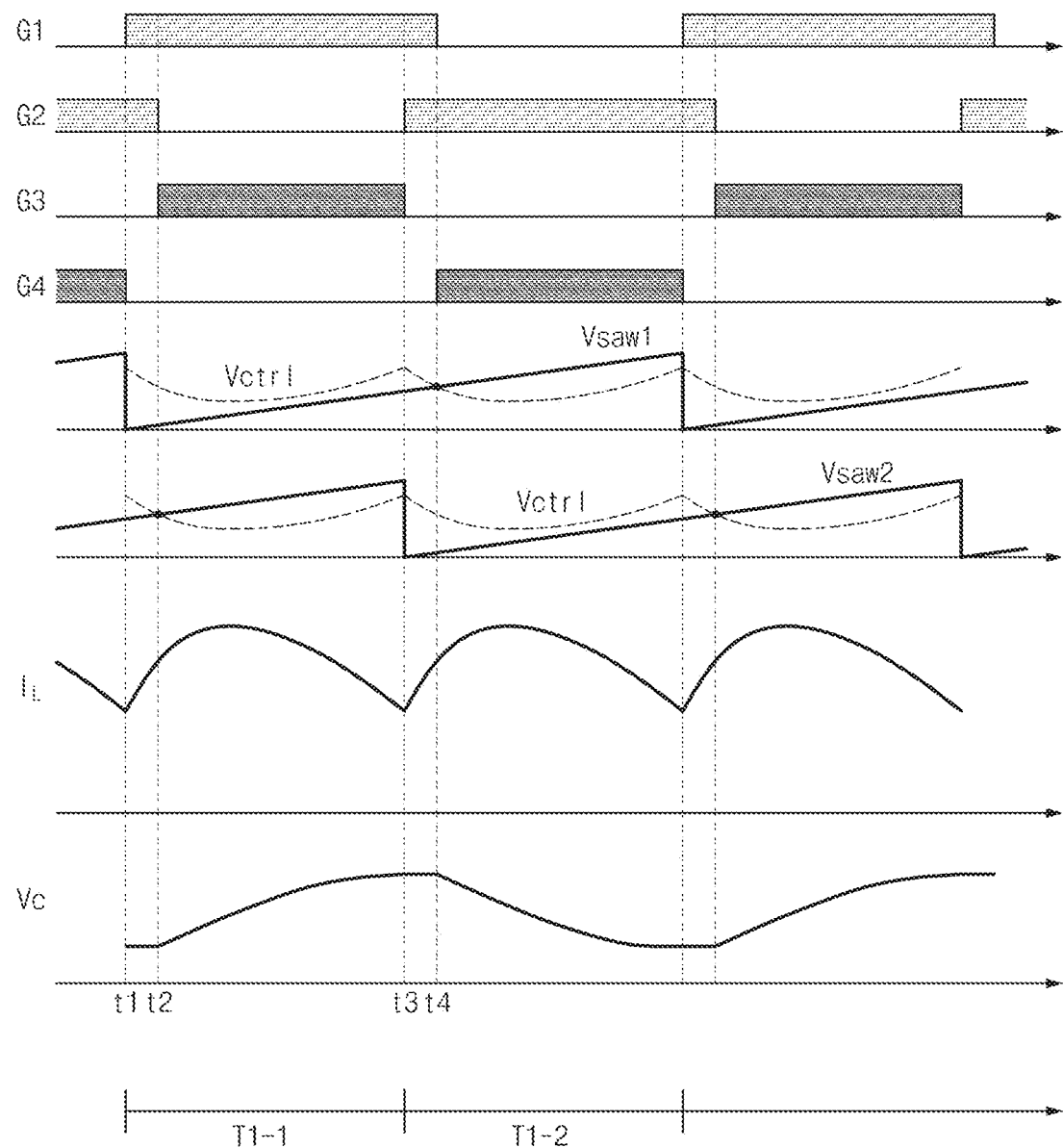
FIG. 10 illustrates a change of a switching signal of a voltage control method in a first state of a second mode, according to an embodiment.

FIG. 10 illustrates a change in a switching signal of a voltage control method in a first state of a second mode, according to an embodiment.

Referring to FIG. 10, the first state may be a state in which the inductor current $I_L$ exceeds '0' and a clamping does not occur in the voltage across the both ends of the flying capacitor 260.

The turn-on time and the turn-off time of the first switch 251 may be determined by the duty control voltage $V_{ctrl}$ and the first triangle wave $V_{saw1}$. The first switch 251 may be turned on at a first time t1 when the first triangle wave $V_{saw1}$ is less than the duty control voltage $V_{ctrl}$. The second switch 252 may be in ON state at the first time t1. The first switch 251 may be turned off at a fourth time t4 when the first triangle wave $V_{saw1}$ becomes greater than the duty control voltage $V_{ctrl}$. At the fourth time t4, the second switch 252 may be in ON state.

The turn-on time and the turn-off time of the second switch 252 may be determined by the duty control voltage $V_{ctrl}$ and the second triangle wave $V_{saw2}$. The second triangle wave $V_{saw2}$ may be a signal in which the first triangle wave $V_{saw1}$ is shifted by a half period (e.g., a first half period T1-1). The second switch 252 may be turned off at a second time t2 when the second triangle wave $V_{saw2}$ is greater than the duty control voltage $V_{ctrl}$. At the second time t2, the first switch 251 may be in ON state. The second switch 252 may be turned on at a third time t3 when the second triangle wave $V_{saw2}$ is less than the duty control voltage $V_{ctrl}$. At the third time t3, the first switch 251 may be in ON state.

In the first half period T1-1 of the first triangle wave $V_{saw1}$, the first switch 251 is turned on (i.e., occurs at the first time t1) and the second switch 252 is turned off (i.e., occurs at the second time t2). In the second half cycle T1-2 of the first triangle wave $V_{saw1}$, the second switch 252 is turned on (i.e., occurs at the third time t3), and the first switch 251 is turned off (i.e., occurs at the fourth time t4).

The control signal G3 of the third switch 253 may have a form opposite to the control signal G2 of the second switch 252. The third switch 253 may be turned off when the second switch 252 is turned on, and may be turned on when the second switch 252 is turned off.

The control signal G4 of the fourth switch 254 may have a form opposite to the control signal G1 of the first switch 251. The fourth switch 254 may be turned off when the first switch 251 is turned on, and may be turned on when the first switch 251 is turned off.

Turn-off timings of the third switch 253 and the fourth switch 254 may be changed to prevent the inductor current $I_L$ from falling below '0'(as shown in FIG. 11). The turn-on timings of the third switch 253 and the fourth switch 254 may be changed by clamping of the flying capacitor 260 (as shown in FIG. 12).

FIG. 11 illustrates a change in a switching signal of a voltage control method in a second state of a second mode, according to an embodiment.

Referring to FIG. 11, the second state may be a state in which a zero current period of the inductor current $I_L$ (e.g., a period in which $I_L$ is '0') is included, and clamping does not occur in the voltage across the both ends of the flying capacitor 260. The inductor current $I_L$ may be changed depending on a load (e.g., the battery 220). When the load decreases, a discontinuous conduction mode (DCM) in which there is a period in which the inductor current $I_L$ becomes '0' may be operated (e.g., the second state). Since a period in which the current value of the inductor current $I_L$ becomes '0' is decreased as the load increases, a continuous conduction mode (CCM) in which the zero current period does not exist may be operated (the first state, refer to FIG. 10).

In the second state, the switching operation of the first switch 251 and the second switch 252 may be the same as that of FIG. 10 associated with the first state.

In the second state, the turn-on time of the third switch 253 may be the same as the turn-off time of the second switch 252, and the turn-on time of the fourth switch 254 may be the same as the turn-off time of the first switch 251. The turn-on timing of the third switch 253 and the fourth switch 254 may be changed by clamping of the voltage across the both ends of the flying capacitor 260 (as shown in FIG. 12).

The control circuit 801 may control the turn-off timing of the third switch 253 or the fourth switch 254 by using a time point at which the inductor current $I_L$ becomes '0'. In this case, the third switch 253 or the fourth switch 254 may operate as an ideal diode. Through this, it is possible to prevent the inductor current $I_L$ from becoming a negative value.

In the first half period T1-1 of the first triangle wave $V_{saw1}$, when the first switch 251 is in the turned on state at a fifth time t5 when the inductor current $I_L$ becomes '0', the third switch 253 may be turned off. Accordingly, the third switch 253 may be turned off before the second switch 252 is turned on.

When the second switch 252 is in the turned on state at a sixth time t6 when the inductor current $I_L$ becomes '0' in a second half period T1-2 of the first triangle wave $V_{saw1}$, the fourth switch 254 may be turned off. Accordingly, the fourth switch 254 may be turned off before the first switch 251 is turned on.

FIG. 12 illustrates a change in a switching signal of a voltage control method in a third state of a second mode, according to an embodiment.

Referring to FIG. 12, the third state may be a state in which the voltage across the both ends of the flying capacitor 260 is clamped without including the zero current period of the inductor current $I_L$ (e.g., a period in which $I_L$ is '0').

In the third state, the switching operation of the first switch 251 and the second switch 252 may be the same as that of FIG. 10 associated with the first state.

The control circuit 801 may control the turn-on timing of the third switch 253 or the fourth switch 254 by using a time point at which the voltage Vc across the both ends of the flying capacitor 260 is clamped to the input voltage $V_{IN}$ or the ground voltage 0V. When the voltage across the both ends of the flying capacitor 260 is clamped to the input voltage $V_{IN}$ or the ground voltage 0V, if the third switch 253 and the fourth switch 254 are not turned on, and the current may flow through body diodes inside the third switch 253 and the fourth switch 254, and switching loss may increase. When the voltage across the both ends of the flying capacitor 260 is clamped to the input voltage $V_{IN}$ or the ground voltage 0V the control circuit 801 may reduce losses due to current flowing through the body diodes inside the third switch 253 and the fourth switch 254 by turning on the third switch 253 and the fourth switch 254.

Since the voltage of the flying capacitor 260 is in a floating state, the control circuit 801 may detect a zero crossing point of the upper voltage VCA (e.g., the voltage of the first node 410) of the flying capacitor 260 and a zero crossing point of the lower voltage VCB (e.g., the voltage of the third node 430) without directly detecting the voltage Vc across both ends of the flying capacitor 260, and may determine the turn-on time of the third switch 253 and the fourth switch 254.

In the first half-period T1-1 of the first triangle wave $V_{saw1}$, the fourth switch 254 may be turned on at a seventh time t7 when the voltage VCB of the third node 430 crosses to '0' (e.g., the voltage Vc across both ends of flying capacitor 260 being clamped to the input voltage $V_{IN}$). Accordingly, the fourth switch 254 may be turned on before the first switch 251 is turned off. The seventh time t7 may be a time point when the body diode inside the fourth switch 254 starts to conduct.

In the second half period T1-2 of the first triangle wave $V_{saw1}$, the third switch 253 may be turned on at an eighth time t8 when the voltage VCA of the first node 410 crosses to '0'(e.g., the voltage Vc across the both ends of the flying capacitor 260 being clamped to the ground voltage 0V). Accordingly, the third switch 253 may be turned on before the second switch 252 is turned off. The eighth time t8 may be a time point at which the body diode inside the third switch 253 starts to conduct.

The turn-off time of the third switch 253 may be the same as the turn-on time of the second switch 252, and the turn-off time of the fourth switch 254 may be the same as the turn-on time of the first switch 251.

Figure 13:
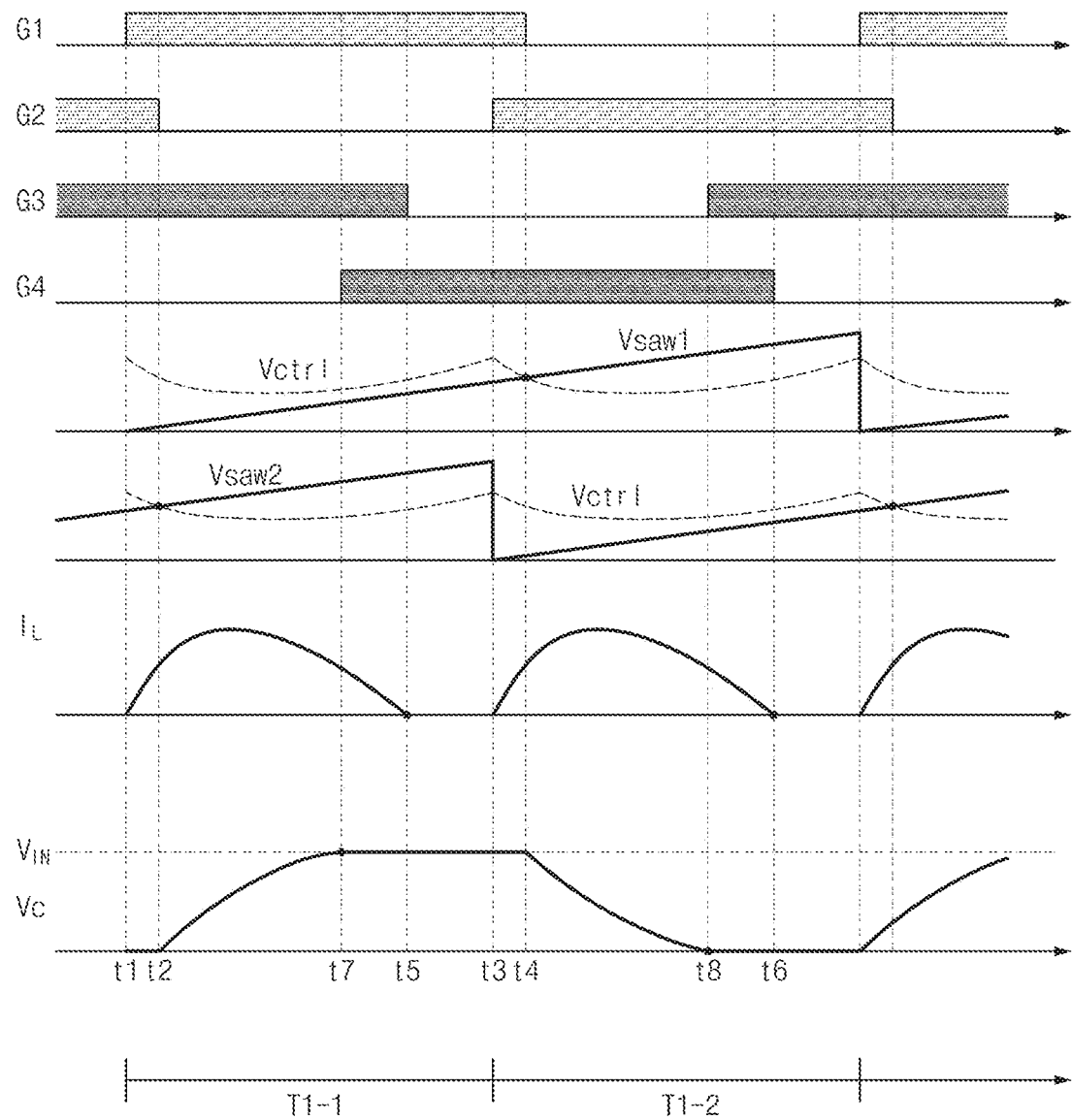
FIG. 13 illustrates a change in a switching signal of a voltage control method in a fourth state of a second mode, according to an embodiment.

FIG. 13 illustrates a change in a switching signal of a voltage control method in a fourth state of a second mode, according to an embodiment.

Referring to FIG. 13, the fourth state may be a state in which the zero current period of the inductor current $I_L$ (e.g., a period in which $I_L$ is '0') is included, and the clamping occurs in the voltage across the both ends of the flying capacitor 260.

In the fourth state, the switching operation of the first switch 251 and the second switch 252 may be the same as that of FIG. 10 associated with the first state.

A turn-on operation of the third switch 253 and the fourth switch 254 may be changed at a time point at which the voltage Vc of both ends of the flying capacitor 260 is clamped to the input voltage $V_{IN}$ or the ground voltage 0V. The turn-on operation of the third switch 253 and the fourth switch 254 may be the same as that of FIG. 12, and a turn-off operation of the third switch 253 and the fourth switch 254 may be the same as that of FIG. 11.

In the first half period T1-1 of the first triangle wave $V_{saw1}$, the fourth switch 254 may be turned on at the seventh time t7 when the voltage VCB of the third node 430 crosses to '0'(e.g., the voltage Vc across the both ends of the flying capacitor 260 being clamped to the input voltage $V_{IN}$). The fourth switch 254 may be turned on before the first switch 251 is turned off.

In the first half period T1-1 of the first triangle wave $V_{saw1}$, when the first switch 251 is in the turned on state at the fifth time t5 when the inductor current $I_L$ becomes '0', the third switch 253 may be turned off. The third switch 253 may be turned off before the second switch 252 is turned on.

In the second half period T1-2 of the first triangle wave $V_1$, the third switch 253 may be turned on at the eighth time t8 when the voltage VCA of the first node 410 crosses to '0' (e.g., the voltage Vc of both ends of the flying capacitor 260 being clamped to the ground voltage 0V). The third switch 253 may be turned on before the second switch 252 is turned off.

In the second half period T1-2 of the first triangle wave $V_{saw1}$, when the second switch 252 is in the turned on state at the sixth time t6 when the inductor current $I_L$ is '0' (e.g., the sensing voltage Vcs is '0'), the fourth switch 254 may be turned off. The fourth switch 254 may be turned off before the first switch 251 is turned on.

Figure 14:
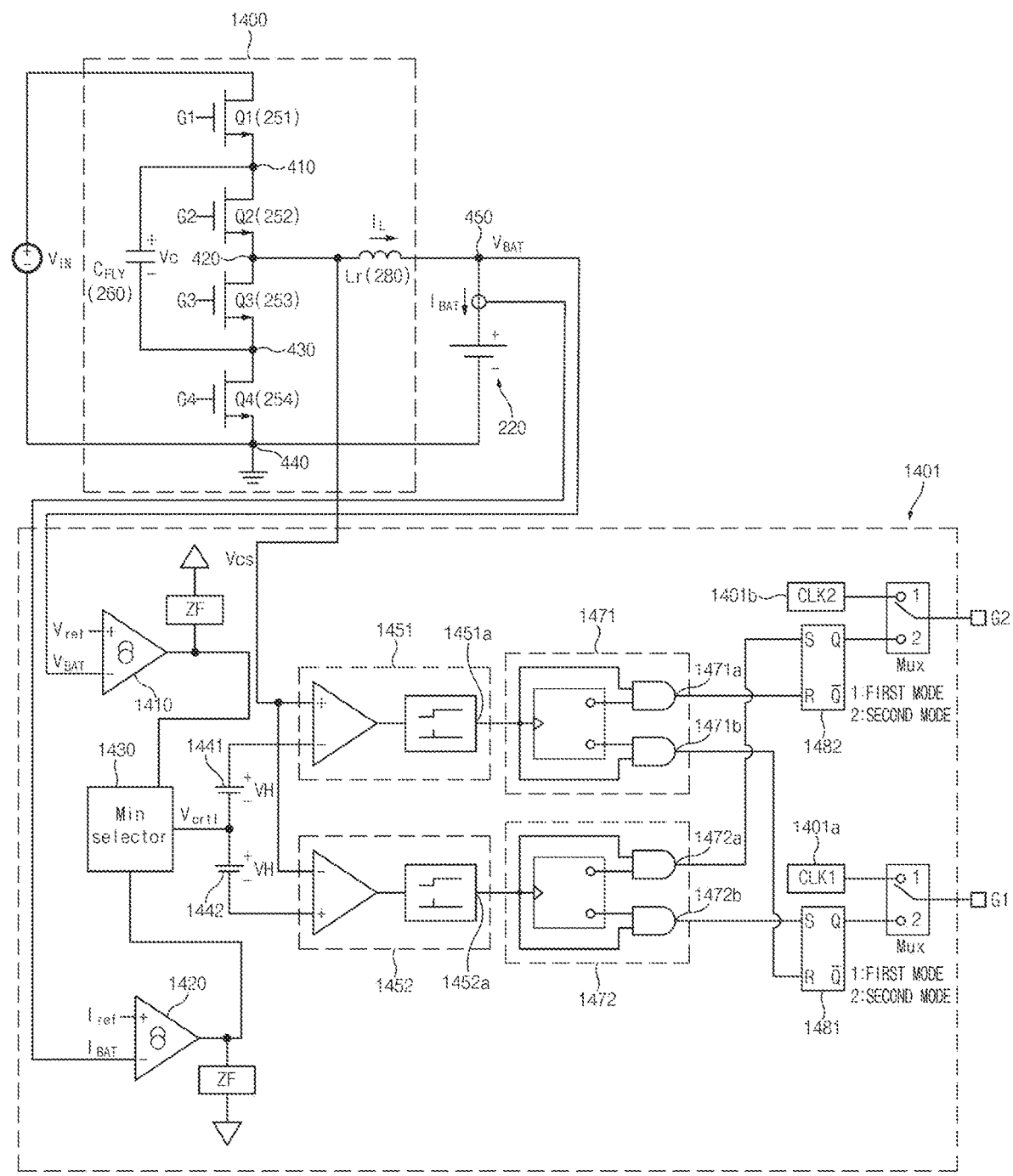
FIG. 14 illustrates a switching control circuit of a current control method in a second mode, according to an embodiment.

FIG. 14 illustrates a switching control circuit of a current control method in a second mode, according to an embodiment. FIG. 14 is an example, and the disclosure is not limited thereto. The charging circuit 1400 in FIG. 14 may correspond to the first charging circuit 230 or the second charging circuit 240 operating in the second mode.

Referring to FIG. 14, in the second mode, the voltage conversion ratio of the charging circuit 1430 may be adjusted based on the degree of charge of the battery 220. In the second mode, the charging circuit 230 may operate as the 3-level buck circuit in which the power conversion ratio is adjusted in the PWM method. In the second mode, the charging circuit 230 may operate depending on the degree of charge of the battery 220.

In the second mode, the switching operation of the plurality of switches 251 to 254 (e.g., QHA1 to QHA4 or QHB1 to QHB4 in FIG. 4) of the charging circuit 1400 may be controlled based on the current flowing into the battery 220 or the voltage across the both ends of the battery 220. The flying capacitor 260 (e.g., the first flying capacitor 233 or the second flying capacitor 243 in FIG. 4) of the charging circuit 1400 may operate in one of the charge state, the idle state, or the discharge state depending on the switching of the plurality of switches 251 to 254.

A control circuit 1401 may generate signals for controlling the first to fourth switches 251 to 254.

In the first mode, the control circuit 1401 may generate the first control signal G1 by using a signal of a first clock generator 1401a CLK1 having a 50% duty cycle. The control circuit 1401 may generate the second control signal G2 for controlling the second switch, based on a signal of a second clock generator 1401b CLK2 having a 50% duty cycle. The signal of the second clock generator 1401b CLK2 may be a signal obtained by inverting the signal of the first clock generator 1401a CLK1.

In the first mode, the third control signal G3 may be the same as the first control signal G1. The fourth control signal G4 that controls the fourth switch 254 may be the same as the second control signal G2. The second control signal G2 may have a phase opposite to that of the first control signal G1.

In the first mode, the first control signal G1 and the second control signal G2 may each have the fixed first duty cycle (e.g., about 50%) and the first frequency (e.g., about 500 kHz). The first frequency (e.g., about 500 kHz) may be set to the same value as the resonant frequency of the flying capacitor 260 and the inductor 280 of the output terminal.

In the second mode, the control circuit 1401 may determine the duty control voltage $V_{ctrl}$, based on the voltage $V_{BAT}$ across the both ends of the battery 220 and the current $I_{BAT}$ flowing into the battery 220.

The control circuit 1401 may amplify a voltage difference between the voltage $V_{BAT}$ across the both ends of the battery 220 and the set reference voltage $V_{ref}$ through a first error amplifier 1410. The control circuit 1401 may amplify a current difference between the current $I_{BAT}$ flowing into the battery 220 and the set reference current $I_{ref}$ through a second error amplifier 1420. The control circuit 1401 may compare an output of the first error amplifier 1410 with an output of the second error amplifier 1420 through a comparator 1430, and may determine the duty control voltage $V_{ctrl}$, based on a relatively smaller value. In FIG. 14, a case in which the duty control voltage $V_{ctrl}$ is determined by using both the voltage $V_{BAT}$ across the both ends of the battery 220 and the current $I_{BAT}$ flowing into the battery 220 is illustrated, but the disclosure is not limited thereto. The duty control voltage $V_{ctrl}$ may be determined using one of the voltage $V_{BAT}$ across the both ends of the battery 220 and the current $I_{BAT}$ flowing into the battery 220.

In the second mode, the control circuit 1401 may control the first to fourth switches 251 to 254 in a current mode control method, based on the inductor current $I_L$ flowing through the inductor 280 included in the charging circuit 1400. The control circuit 1401 may adjust the switching frequency of the first to fourth switches 251 to 254 by using the sensing voltage Vcs proportional to the detected inductor current $I_L$. The current control method using the inductor current $I_L$ may enable more precise switching control than the voltage control method in FIG. 8.

When using the inductor current $I_L$ in the second mode, the switching frequency of the first to fourth switches 251 to 254 may be the same as or similar to the switching frequency in the first mode. Accordingly, in the second mode of the current mode control method, a power conversion efficiency may be relatively high, and an electromagnetic interference (EMI) reduction and a system efficiency may be improved by the operation of the resonant converter. In addition, in the second mode of the current mode control method, the switching frequency is automatically reduced depending on load fluctuations, thereby improving efficiency under light load.

The control circuit 1401 may apply a hysteresis voltage VH to the duty control voltage $V_{ctrl}$. The control circuit 1401 may input a first band voltage (hereinafter, a band upper limit voltage)($V_{ctrl}$+VH) that is generated by adding the hysteresis voltage VH 1441 to the duty control voltage V, to a first cross detector 1451. The control circuit 1401 may input a second band voltage (hereinafter, a band lower limit voltage) ($V_{ctrl}$−VH) that is generated by lowering the hysteresis voltage VH 1442 from the duty control voltage $V_{ctrl}$ to a second cross detector 1452.

The control circuit 1401 may change the hysteresis voltage VH to determine a switching frequency and a ripple of the inductor current $I_L$. The control circuit 1401 may change the hysteresis voltage VH (e.g., 1441 and/or 1442) by using a phase-locked loop (PLL) circuit.

The control circuit 1401 may generate the inductor sensing voltage Vcs generated based on the inductor current $I_L$. The inductor current $I_L$ and the inductor sensing voltage Vcs may have a linear relationship (Vcs=k*$I_L$). The inductor sensing voltage Vcs may be determined by a time point when a sensing signal of the inductor current $I_L$ reaches the band upper limit voltage and the band lower limit voltage, respectively.

The inductor sensing voltage Vcs may be input to the first cross detector 1451 and the second cross detector 1452, respectively. The first cross detector 1451 may generate a first trigger signal through an output terminal 1451a at a timing when the inductor sensing voltage Vcs and the band upper limit voltage $V_{ctrl}$+VH are the same. The second cross detector 1452 may generate a second trigger signal through an output terminal 1452a at a timing when the inductor sensing voltage Vcs and the band lower limit voltage $V_{ctrl}$−VH are the same.

The control circuit 1401 may turn on the first switch 251 and the second switch 252 at different timings, based on the second trigger signal. The first switch 251 may be turned on by the second trigger signal in the first period of the inductor sensing voltage Vcs, and the second switch 252 may be turned on by the second trigger signal in the second period (e.g., a subsequent period following the first period) of the inductor sensing voltage Vcs.

The control circuit 1401 may turn off the first switch 251 and the second switch 252 at different timings, based on the first trigger signal. In the previous example, the first switch 251 may be turned off by the first trigger signal in the second period of the inductor sensing voltage Vcs, and the second switch 252 may be turned off by the first trigger signal in a third period (e.g., a subsequent period following the second period) of the inductor sensing voltage Vcs.

A first signal divider 1471 may receive the first trigger signal through the output terminal 1451a of the first cross detector 1451. The first signal divider 1471 may include a toggle flip-flop that operates by using the first trigger signal as a clock signal. A first output terminal 1471a of the first signal divider 1471 may generate a signal for turning off the second switch 252. The first output terminal 1471a may be connected to an R terminal of a set-reset (SR) flip-flop 1482 that generates the second control signal G2. A second output terminal 1471b of the first signal divider 1471 may generate a signal for turning off the first switch 251. The second output terminal 1471b of the first signal divider 1471 may be connected to the R terminal of an SR flip-flop 1481 that generates the first control signal G1.

A second signal divider 1472 may receive the second trigger signal through the output terminal 1452a of the second cross detector 1452. The second signal divider 1472 may include a toggle flip-flop that operates by using the second trigger signal as a clock signal. A first output terminal 1472a of the second signal divider 1472 may generate a signal for turning on the second switch 252. The first output terminal 1472a may be connected to the S terminal of the SR flip-flop 1482 that generates the second control signal G2. A second output terminal 1472b of the second signal divider 1472 may generate a signal for turning on the first switch 251. The second output terminal 1472b of the second signal divider 1472 may be connected to the S terminal of the SR flip-flop 1481 that generates the first control signal G1.

Figure 15:
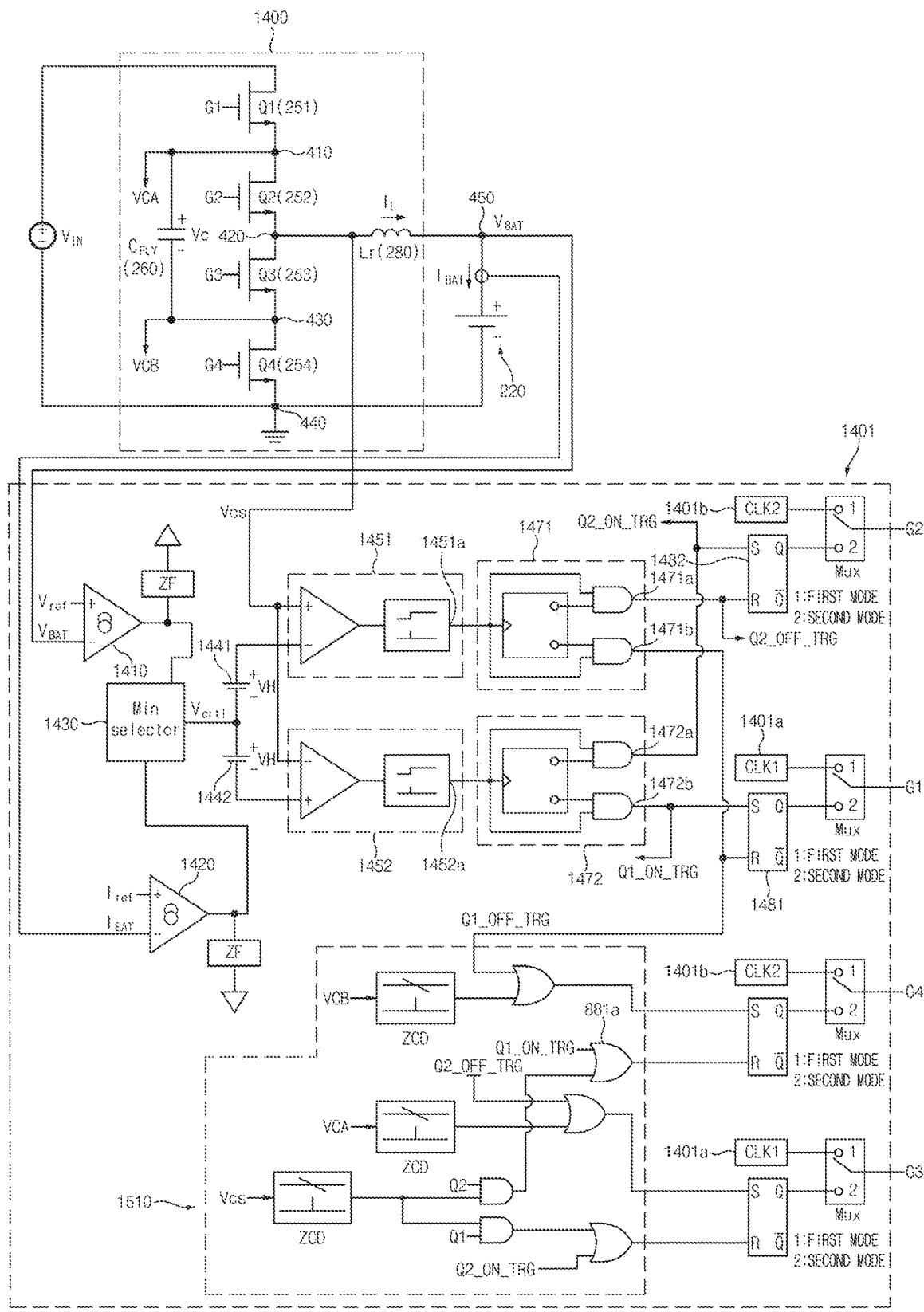
FIG. 15 illustrates a control circuit that additionally uses the voltage across both ends of a flying capacitor, according to an embodiment.

FIG. 15 illustrates a control circuit that additionally uses a voltage across both ends of a flying capacitor, according to an embodiment.

Referring to FIG. 15, the control circuit 1401 may further include a voltage detector 1510.

The voltage detector 1510 may control a switching operation of the third switch 253 or the fourth switch 254 by using the voltage Vc across of the both ends of the flying capacitor 260. In addition, the voltage detector 1510 may control the switching operation of the third switch 253 or the fourth switch 254 by using a time point when the sensing voltage Vcs becomes '0'.

The voltage detector 1510 may control the switching operation of the third switch 253 or the fourth switch 254 by using the voltage Vc across the both ends of the flying capacitor 260. The voltage detector 1510 may adjust the turn-on timing of the third switch 253 or the turn-on timing of the fourth switch 254 depending on whether the voltage Vc across the both ends of the flying capacitor 260 is clamped to the ground voltage 0V or the input voltage $V_{IN}$.

Figure 18:
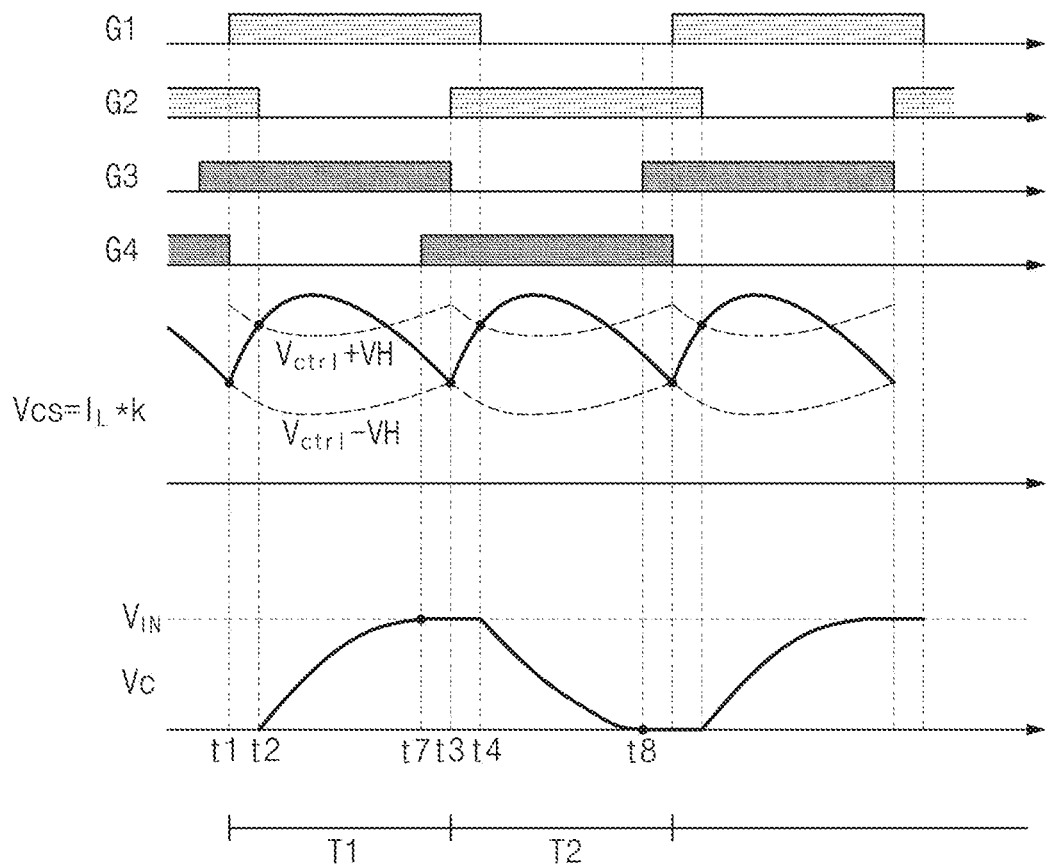
FIG. 18 illustrates a change in a switching signal of a current control method in a third state of a second mode, according to an embodiment.

The turn-on timing of the third switch 253 may be determined by a relatively faster one of a time point at which the voltage VCA of the first node 410 crosses to '0' (or a time point at which the voltage Vc across the both ends of the flying capacitor 260 is clamped to the ground voltage) and a point at which the second switch 252 is turned off (e.g., a time point at which a signal is provided to the first output terminal 1471*a* of the first signal divider 1471) (as shown in FIG. 18).

The turn-on time of the fourth switch 254 may be determined by a relatively faster one of a time point at which the voltage VCB of the third node 430 crosses to '0' (or a time point at which the voltage Vc across the both ends of the flying capacitor 260 is clamped to the input voltage $V_{IN}$) and a time point at which the first switch 251 is turned off (e.g., a time point at which a signal is provided to the second output terminal 1471*b* of the first signal divider 1471) (as shown in FIG. 18).

The voltage detector 1510 may control the switching operation of the third switch 253 or the fourth switch 254 by using a time point at which the inductor current $I_L$ flowing through the inductor 280 (or the sensing voltage Vcs proportional to the inductor current $I_L$) becomes '0'.

Figure 17:
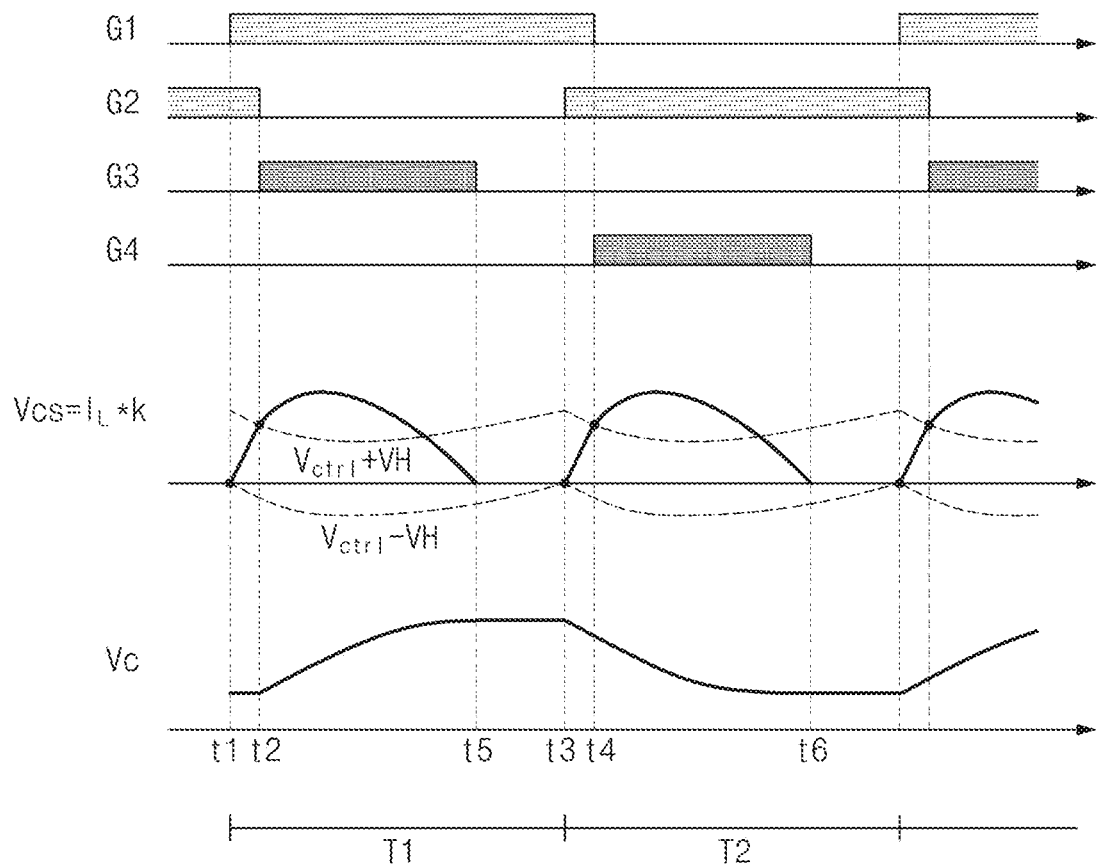
FIG. 17 illustrates a change of a switching signal of a current control method in a second state of a second mode, according to an embodiment.

The turn-off time of the third switch 253 may be determined by a relatively faster one of a time point at which the second switch 252 is turned on (e.g., a time point at which a signal is provided to the first output terminal 1472*a* of the second signal divider 1472) and a time point at which the inductor current $I_L$ crosses to '0' while the first switch 251 is conducting (i.e., turn-on) (e.g., a time point at which the sensing voltage Vcs crosses to '0'). Through this, it is possible to prevent the inductor current $I_L$ from falling below '0' (as shown in FIG. 17).

The turn-off time of the fourth switch 254 may be determined by a relatively faster one of a time point at which the first switch 251 is turned on (e.g., a time point at which a signal is provided to the second output terminal 1472*b* of the second signal divider 1472) and a time point at which the inductor current $I_L$ crosses to '0' while the second switch 252 is conducting (turn-on) (e.g., a time point at which the sensing voltage Vcs crosses to '0'). Through this, it is possible to prevent the inductor current $I_L$ from falling below 'O' (as shown in FIG. 17).

Figure 16:
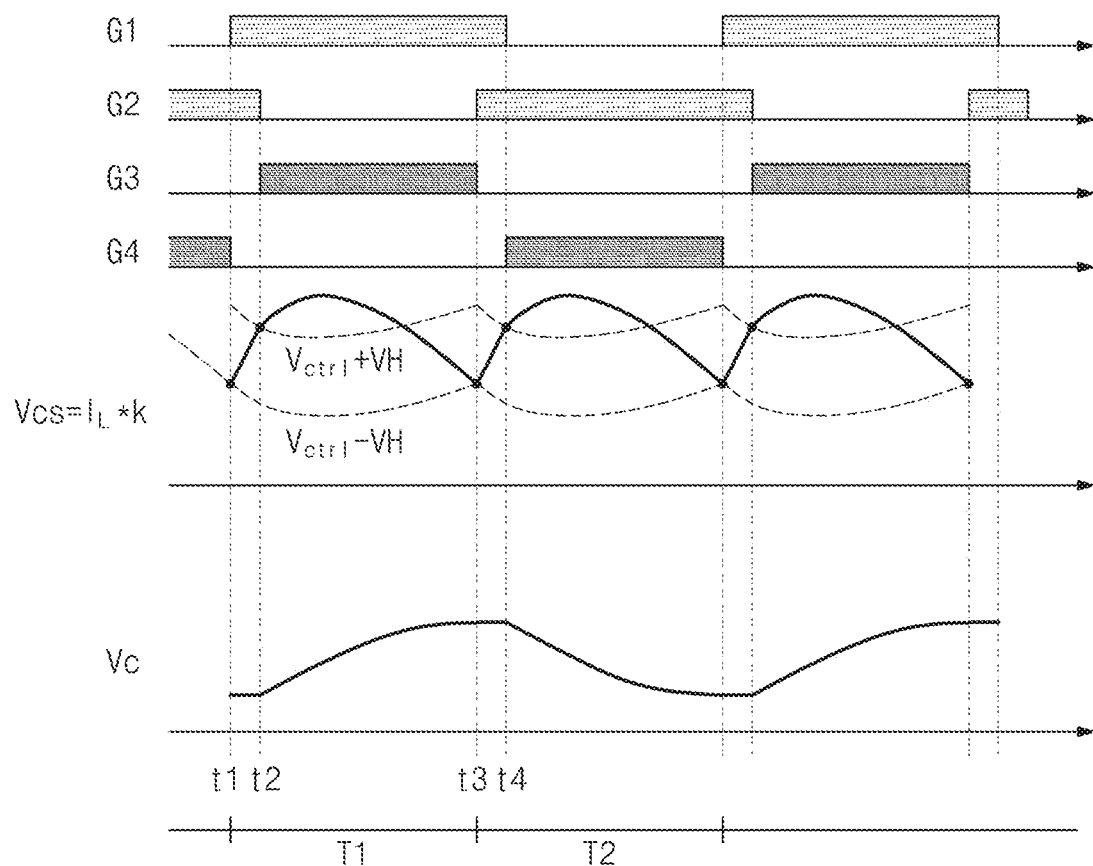
FIG. 16 illustrates a change in a switching signal of a current control method in a first state of a second mode, according to an embodiment.

FIG. 16 illustrates a change in a switching signal of a current control method in a first state of a second mode, according to an embodiment.

Referring to FIG. 16, the first state may be a state in which the inductor current $I_L$ exceeds '0' and the clamping does not occur in the voltage across the both ends of the flying capacitor 260.

The turn-on time of the first switch 251 and the turn-on time of the second switch 252 may be determined by the inductor sensing voltage Vcs and the band lower limit voltage $V_{ctrl}$-VH. In the first period T1 of the sensing voltage Vcs, the first switch 251 may be turned on at a first time t when the inductor sensing voltage Vcs and the band lower limit voltage $V_{ctrl}$-VH are the same. The second switch 252 may be in ON state at the first time t1. In the second period T2 of the sensing voltage Vcs, the second switch 252 may be turned on at the third time t3 when the inductor sensing voltage Vcs and the band lower limit voltage $V_{ctrl}$-VH are the same. At the third time t3, the first switch 251 may be in ON state.

The turn-off time of the first switch 251 and the turn-off time of the second switch 252 may be determined by the inductor sensing voltage Vcs and the band upper limit voltage $V_{ctrl}$+VH. In the first period T1, the second switch 252 may be turned off at the second time t2 when the inductor sensing voltage Vcs and the band upper limit voltage $V_{ctrl}$+VH are the same. At the second time t2, the first switch 251 may be in ON state. In the second period T2, the first switch 251 may be turned off at the fourth time t4 when the inductor sensing voltage Vcs and the band upper limit voltage $V_{ctrl}$+VH are the same. At the fourth time t4, the second switch 252 may be ON state.

In the first period T1 and the second period T2, the turn-on of the first switch 251 (e.g., occurs at the first time t1), the turn-off of the second switch 252 (e.g., occurs at the second time t2), the turn-on of the second switch 252 (e.g., occurs at the third time t3), and the turn-off of the first switch 251 (e.g., occurs at the fourth time t4) may occur sequentially.

The control signal G3 of the third switch 253 may have a form opposite to the control signal G2 of the second switch 252. The third switch 253 may be turned off when the second switch 252 is turned on, and may be turned on when the second switch 252 is turned off.

The control signal G4 of the fourth switch 254 may have a form opposite to the control signal G1 of the first switch 251. The fourth switch 254 may be turned off when the first switch 251 is turned on, and may be turned on when the first switch 251 is turned off.

The turn-off timing of the third switch 253 and the fourth switch 254 may be changed to prevent the inductor current $I_L$ from falling below 'O' (as shown in FIG. 17). The turn-on timing of the third switch 253 and the fourth switch 254 may be changed by clamping (as shown in FIG. 18).

FIG. 17 illustrates a change in a switching signal of a current control method in a second state of a second mode, according to an embodiment.

Referring to FIG. 17, the second state may be a state in which the zero current period of the inductor current $I_L$ (e.g., the period in which $I_L$ is '0') is included, and the clamping does not occur in the voltage across the both ends of the flying capacitor 260. The inductor current $I_L$ may be changed depending on the load (e.g., the battery 220). When the load decreases, the DCM in which there is a period in which the inductor current $I_L$ becomes '0' may be operated (e.g., the second state). Since a period in which the current value of the inductor current $I_L$ becomes '0' is decreased as the load increases, the CCM in which the zero current period does not exist may be operated (e.g., the first state, as shown in FIG. 16).

In the second state, the switching operation of the first switch 251 and the second switch 252 may be the same as that of FIG. 10 associated with the first state.

In the second state, the turn-on time of the third switch 253 may be the same as the turn-off time of the second switch 252, and the turn-on time of the fourth switch 254 may be the same as the turn-off time of the first switch 251. The turn-on timing of the third switch 253 and the fourth switch 254 may be changed by clamping of the voltage across the both ends of the flying capacitor 260 (as shown in FIG. 18).

The turn-on timing of the third switch 253 and the fourth switch 254 may be changed by clamping (as shown in FIG. 12).

The control circuit 1401 may control the turn-off timing of the third switch 253 or the fourth switch 254 by using a time point at which the inductor current $I_L$ becomes '0'. In this case, the third switch 253 or the fourth switch 254 may operate as the ideal diode. Through this, it is possible to prevent the inductor current $I_L$ from becoming a negative value.

In the first period T1, when the first switch 251 is in the turned on state at the fifth time t5 when the inductor current $I_L$ is '0'(e.g., the sensing voltage Vcs is '0'), the third switch 253 may be turned off. Accordingly, the third switch 253 may be turned off before the second switch 252 is turned on.

In the second period T2, when the second switch 252 is in the turned on state at the sixth time t6 when the inductor current $I_L$ is '0' (e.g., the sensing voltage Vcs is '0'), the fourth switch 254 may be turned off. Accordingly, the fourth switch 254 may be turned off before the first switch 251 is turned on.

FIG. 18 illustrates a change in a switching signal of a current control method in a third state of a second mode, according to an embodiment.

Referring to FIG. 18, the third state may be a state in which the zero current period of the inductor current $I_L$ (e.g., a period in which $I_L$ is '0') is not included, and clamping occurs in the voltage across the both ends of the flying capacitor 260.

In the third state, the switching operation of the first switch 251 and the second switch 252 may be the same as that of FIG. 10 associated with the first state.

The control circuit 1401 may control the turn-on timing of the third switch 253 or the fourth switch 254 by using a time point at which the voltage across the both ends of the flying capacitor 260 is clamped to the input voltage $V_{IN}$ or the ground voltage 0V. When the voltage across the both ends of the flying capacitor 260 is clamped to the input voltage $V_{IN}$ or the ground voltage 0V, if the third switch 253 and the fourth switch 254 are not turned on, the current may flow through the body diodes inside the third switch 253 and the fourth switch 254, and the switching loss may increase. When the voltage across the both ends of the flying capacitor 260 is clamped to the input voltage $V_{IN}$ or the ground voltage 0V, the control circuit 1401 may reduce losses due to the current flowing through the body diodes inside the third switch 253 and the fourth switch 254, by turning on the third switch 253 and the fourth switch 254.

Since the voltage of the flying capacitor 260 is in the floating state, the control circuit 1401 may detect the zero crossing point of the upper voltage VCA (e.g., the voltage of the first node 410) of the flying capacitor 260 and the zero crossing point of the lower voltage VCB (e.g., the voltage of the third node 430) without directly detecting the voltage of the flying capacitor 260, and may determine the turn-on time of the third switch 253 and the fourth switch 254.

In the first period T1, the fourth switch 254 may be turned on at the seventh time t7 when the voltage VCB of the third node 430 crosses to '0' (e.g., the voltage Vc of both ends of the flying capacitor 260 being clamped to the input voltage $V_{IN}$). Accordingly, the fourth switch 254 may be turned on before the first switch 251 is turned off. The seventh time t7 may be a time point at which the body diode inside the fourth switch 254 starts to conduct.

In the second period T2, the third switch 253 may be turned on at the eighth time t8 when the voltage VCA of the first node 410 crosses to '0' (e.g., the voltage Vc of both ends of the flying capacitor 260 is clamped to the ground voltage 0V). Accordingly, the third switch 253 may be turned on before the second switch 252 is turned off. The eighth time t8 may be a time point at which the body diode inside the third switch 253 starts to conduct.

The turn-off time of the third switch 253 may be the same as the turn-on time of the second switch 252, and the turn-off time of the fourth switch 254 may be the same as the turn-on time of the first switch 251.

Figure 19:
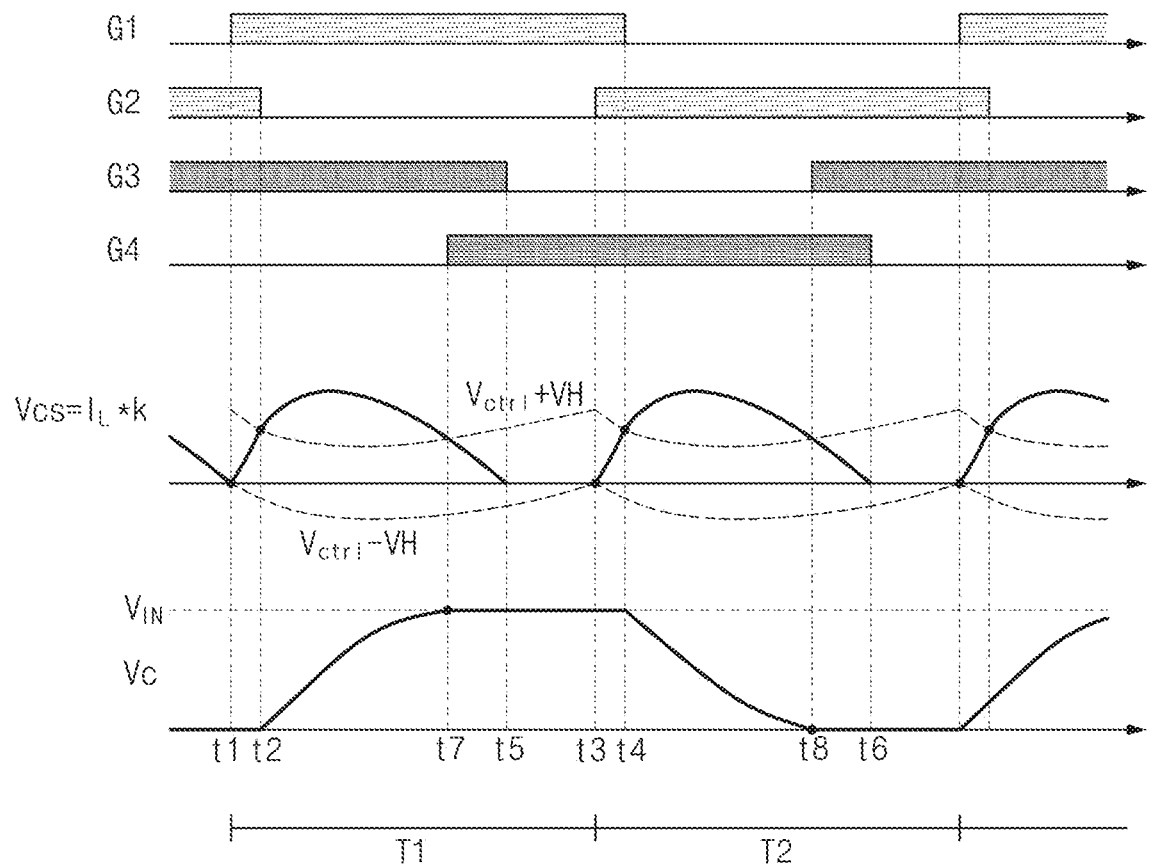
FIG. 19 illustrates a change in a switching signal of a current control method in a fourth state of a second mode, according to an embodiment.

FIG. 19 illustrates a change in a switching signal of a current control method in a fourth state of a second mode, according to an embodiment.

Referring to FIG. 19, the fourth state may be a state in which the zero current period of the inductor current $I_L$ (e.g., a period in which $I_L$ is '0') is included and the clamping occurs in the voltage across the both ends of the flying capacitor 260.

In the fourth state, the switching operation of the first switch 251 and the second switch 252 may be the same as that of FIG. 10 associated with the first state.

The turn-on operation of the third switch 253 and the fourth switch 254 may be changed by a time point at which the voltage Vc across the both ends of the flying capacitor 260 is clamped to the input voltage $V_{IN}$ or the ground voltage 0V. The turn-on operation of the third switch 253 and the fourth switch 254 may be the same as that of FIG. 18, and the turn-off operation of the third switch 253 and the fourth switch 254 may be the same as that of FIG. 17.

In the first period T1, the fourth switch 254 may be turned on at the seventh time t7 when the voltage VCB of the third node 430 crosses to '0' (e.g., the voltage Vc across the both ends of the flying capacitor 260 being clamped to the input voltage $V_{IN}$). The fourth switch 254 may be turned on before the first switch 251 is turned off.

In the first period T1, when the first switch 251 is in the turned on state at the fifth time t5 when the inductor current $I_L$ becomes '0' (e.g., the sensing voltage Vcs is '0'), the third switch 253 may be turned off. The third switch 253 may be turned off before the second switch 252 is turned on.

In the second period T2, the third switch 253 may be turned on at the eighth time t8 when the voltage VCA of the first node 410 is clamped to the ground voltage 0V. The third switch 253 may be turned on before the second switch 252 is turned off.

In the second period T2, when the second switch 252 is in the turned on state at the sixth time t6 when the inductor current $I_L$ becomes '0' (e.g., the sensing voltage Vcs is '0'), the fourth switch 254 may be turned off. The fourth switch 254 may be turned off before the first switch 251 is turned on.

The electronic device according to various embodiments disclosed in the disclosure may be various types of devices. The electronic device may include, for example, a portable communication device (e.g., a smartphone), a computer device, a portable multimedia device, a mobile medical appliance, a camera, a wearable device, or a home appliance. The electronic device according to an embodiment of the disclosure should not be limited to the above-mentioned devices.

According to various embodiments, an electronic device (e.g., the electronic device 101 of FIG. 1, or the electronic device 201 of FIG. 2) includes a battery, a power management module electrically connected to the battery and that manages a charging or a discharging of the battery, and a processor electrically connected to the power management module, and the power management module includes a first charging circuit that includes a first switch group, a first capacitor, and a first inductor, a second charging circuit that includes a second switch group, a second capacitor, and a second inductor, and a power path distributor that distributes power from a first external power supply device or a second external power supply device to the first charging circuit or the second charging circuit, and the power management module is configured to identify a connection between the power path distributor and one of the first external power supply device or the second external power supply device, to determine a type of the connected power supply device, to allow the first charging circuit and the second charging circuit to operate in a first mode that allows the first charging circuit and the second charging circuit to each have a fixed voltage conversion ratio such that the battery is charged, when the type of the connected power supply device is a first type, and to allow the first charging circuit and the second charging circuit to operate in a second mode that allows a voltage conversion ratio to be changed corresponding to a charging ratio of the battery such that the battery is charged, when the type of the connected power supply device is a second type.

According to various embodiments, the power management module may determine the type of the connected power supply device, based on a PD communication.

According to various embodiments, the power management module, in a first period of the first mode, may discharge the power of the first capacitor through the first inductor such that the battery may be charged, and the power management module, in a second period of the first mode, may discharge the power of the second capacitor through the second inductor such that the battery may be charged.

According to various embodiments, the power management module, in the first period, may allow the battery to be charged while charging the second capacitor, and wherein the power management module, in the second period, may allow the battery to be charged while charging the first capacitor.

According to various embodiments, the power path distributor may include a third switch group and a third capacitor, and the power management module, in the first mode, may allow the third capacitor to be charged to a specified voltage and to be operated.

According to various embodiments, the power management module, in the first mode, may control the third switch group such that a power terminal that supplies the power of the connected power supply device is connected to the second charging circuit, and the power management module, in the second mode, may control the third switch group such that the power terminal that supplies the power of the connected power supply device is connected to the first charging circuit.

According to various embodiments, the power management module, in the first mode, may be configured to control the first switch group and the second switch group, based on a signal having a fixed duty cycle.

According to various embodiments, the fixed duty cycle may be a duty cycle of 50%.

According to various embodiments, the power management module, in the first mode, may allow the signal to have the same frequency as a first resonant frequency of the first capacitor and the first inductor or a second resonant frequency of the second capacitor and the second inductor.

According to various embodiments, the power management module, in the second mode, may be configured to control the first switch group or the second switch group, based on a signal having a variable duty cycle corresponding to the charging ratio of the battery.

According to various embodiments, the power management module may be configured to change the duty cycle of the signal, based on a PWM.

According to various embodiments, when the first external power supply device or the second external power supply device includes a circuit for controlling a constant voltage or a constant current for the battery, the power management module may determine the first external power supply device or the second external power supply device as the first type.

According to various embodiments, the power management module, in the second mode, may allow the first switch group or the second switch group to be switched in response to an intersection time between a control voltage corresponding to the charging ratio of the battery and a first triangle wave or a second triangle wave, and the second triangle wave may be a signal in which the first triangle wave is delayed by half a wavelength.

According to various embodiments, the power management module, in the second mode, may allow a part of the first switch group or the second switch group to be turned off in response to the intersection time between the control voltage and the first triangle wave.

According to various embodiments, the power management module, in the second mode, may allow a part of the first switch group or the second switch group to be turned on in response to the intersection time between the control voltage and the second triangle wave.

According to various embodiments, the power management module, in the second mode, may be configured to control the first switch group or the second switch group, based on a control signal having a variable duty cycle corresponding to a first inductor current flowing through the first inductor or a second inductor current flowing through the second inductor.

According to various embodiments, the power management module may allow a switching frequency of the first switch group to be changed based on the first inductor current, and the power management module may allow a switching frequency of the second switch group to be changed based on the second inductor current.

According to various embodiments, the power management module may allow the first switch group or the second switch group to be switched in response to an intersection time between one of a first band voltage obtained by applying a first hysteresis voltage to a control voltage corresponding to the charging ratio of the battery or a second band voltage obtained by applying a second hysteresis voltage to the control voltage and a sensing voltage corresponding to one of the first inductor current or the second inductor current.

According to various embodiments, the first switch group may include a first switch electrically connected between a power terminal to which power of the first external power supply device is supplied and a first node, a second switch electrically connected between the first node and the second node, a third switch electrically connected between the second node and a third node, and a fourth switch electrically connected between the third node and a ground part, and one end of the first capacitor may be connected to the first node, the other end of the first capacitor may be connected to the third node, one end of the first inductor may be connected to the second node, and the other end of the first inductor may be connected to a charging terminal of the battery.

According to various embodiments, the power management module may allow the first switch and the second switch to be turned on at different timings respectively by an intersection of the second band voltage and the sensing voltage, and the power management module may allow the first switch and the second switch to be turned off at different timings respectively by an intersection of the first band voltage and the sensing voltage.

According to various embodiments, the power management module may allow the third switch to be operated by a control signal having a phase opposite to a control signal of the second switch, and the power management module may allow the fourth switch to be operated by a control signal having a phase opposite to a control signal of the first switch.

According to various embodiments, the power management module may allow the third switch to be turned off when the sensing voltage becomes '0' before the second switch is turned on, and the power management module may allow the fourth switch to be turned off when the sensing voltage becomes '0' before the first switch is turned on.

According to various embodiments, the power management module may allow the third switch to be turned on when a voltage of the first node is the same as a ground voltage before the second switch is turned off, and the power management module may allow the fourth switch to be turned on when a voltage of the third node is the same as the ground voltage before the first switch is turned off.

According to various embodiments, the power management module may allow the third switch to be turned off when the sensing voltage becomes '0' before the second switch is turned on, and the power management module may allow the fourth switch to be turned off when the sensing voltage becomes '0' before the first switch is turned on.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

An electronic device may use a plurality of resonant SCVDs to cope with all wireless/wired power supply devices that support the direct charging or do not support the direct charging.

An electronic device may configure a resonance type SCVD by using a flying capacitor having a relatively small capacity.

An electronic device may configure a 3-level buck circuit by using a resonant SCVD circuit.

An electronic device may control a switching by using current flowing through the inductor of a resonant SCVD or voltage across both ends of the flying capacitor. Through this, power conversion efficiency during charging may be increased, and EMI may be reduced and system efficiency may be improved due to an operation of a resonant converter. In addition, the electronic device may improve efficiency under a light load by automatically reducing a switching frequency depending on a load fluctuation.

While the disclosure has been shown and described with reference to certain embodiments thereof, it will be understood by those skilled in the art that various changes in form and details may be made therein without departing from the scope of the disclosure. Therefore, the scope of the disclosure should not be defined as being limited to the embodiments, but should be defined by the appended claims and equivalents thereof.

What is claimed is:

1. An electronic device comprising:
a battery; and
a power management module electrically connected to the battery and configured to manage a charging or a discharging of the battery;
wherein the power management module includes:
a first charging circuit configured to include a first switch group, a first capacitor, and a first inductor;
a second charging circuit configured to include a second switch group, a second capacitor, and a second inductor; and
a power path distributor configured to distribute power from a first external power supply device or a second external power supply device to the first charging circuit or the second charging circuit, and
wherein the power management module is configured to:
identify a connection between the power path distributor and one of the first external power supply device or the second external power supply device;
determine a type of the connected power supply device;
when the type of the connected power supply device is a first type, allow the first charging circuit and the second charging circuit to operate in a first mode that allows the first charging circuit and the second charging circuit to each have a fixed voltage conversion ratio such that the battery is charged; and
when the type of the connected power supply device is a second type, allow the first charging circuit and the second charging circuit to operate in a second mode that allows a voltage conversion ratio to be changed corresponding to a charging ratio of the battery such that the battery is charged.

2. The electronic device of claim 1, wherein the power management module determines the type of the connected power supply device based on a power delivery (PD) communication.

3. The electronic device of claim 1, wherein the power management module, in a first period of the first mode, discharges power of the first capacitor through the first inductor such that the battery is charged; and
wherein the power management module, in a second period of the first mode, discharges power of the second capacitor through the second inductor such that the battery is charged.

4. The electronic device of claim 3, wherein the power management module, in the first period, allows the battery to be charged while charging the second capacitor; and
wherein the power management module, in the second period, allows the battery to be charged while charging the first capacitor.

5. The electronic device of claim 3, wherein the power path distributor includes a third switch group and a third capacitor; and
wherein the power management module, in the first mode, allows the third capacitor to be charged to a specified voltage and to be operated.

6. The electronic device of claim 5, wherein the power management module, in the first period of the first mode, controls the third switch group such that a power terminal that supplies the power of the connected power supply device is connected to the second charging circuit; and
wherein the power management module, in the second period of the first mode, controls the third switch group such that the power terminal that supplies the power of the connected power supply device is connected to the first charging circuit.

7. The electronic device of claim 1, wherein the power management module, in the first mode, is configured to control the first switch group and the second switch group, based on a signal having a fixed duty cycle.

8. The electronic device of claim 7, wherein the fixed duty cycle is a duty cycle of 50%.

9. The electronic device of claim 7, wherein the power management module, in the first mode, allows the signal to have a frequency that is the same as a first resonant frequency of the first capacitor and the first inductor or a second resonant frequency of the second capacitor and the second inductor.

10. The electronic device of claim 1, wherein the power management module, in the second mode, is configured to control the first switch group or the second switch group, based on a signal having a variable duty cycle corresponding to the charging ratio of the battery.

11. The electronic device of claim 10, wherein the power management module is configured to change the duty cycle of the signal, based on a pulse width modulation (PWM).

12. The electronic device of claim 1, wherein, when the first external power supply device or the second external power supply device includes a circuit for controlling a constant voltage or a constant current for the battery, the power management module determines the first external power supply device or the second external power supply device as the first type.

13. The electronic device of claim 1, wherein the power management module, in the second mode, allows the first switch group or the second switch group to be switched in response to an intersection time between a control voltage corresponding to the charging ratio of the battery and a first triangle wave or a second triangle wave, and
wherein the second triangle wave is a signal in which the first triangle wave is delayed by half a wavelength.

14. The electronic device of claim 13, wherein the power management module, in the second mode, allows a part of the first switch group or a part of the second switch group to be turned off in response to the intersection time between the control voltage and the first triangle wave.

15. The electronic device of claim 13, wherein the power management module, in the second mode, allows a part of the first switch group or a part of the second switch group to be turned on in response to the intersection time between the control voltage and the second triangle wave.

16. The electronic device of claim 1, wherein the power management module, in the second mode, is configured to control the first switch group or the second switch group, based on a control signal having a variable duty cycle corresponding to a first inductor current flowing through the first inductor or a second inductor current flowing through the second inductor.

17. The electronic device of claim 16, wherein the power management module allows a switching frequency of the first switch group to be changed based on the first inductor current, and
wherein the power management module allows a switching frequency of the second switch group to be changed based on the second inductor current.

18. The electronic device of claim 17, wherein the power management module allows the first switch group or the second switch group to be switched in response to an intersection time between one of a first band voltage obtained by applying a first hysteresis voltage to a control voltage corresponding to the charging ratio of the battery or a second band voltage obtained by applying a second hysteresis voltage to the control voltage and a sensing voltage corresponding to one of the first inductor current or the second inductor current.

19. The electronic device of claim 18, wherein the first switch group includes a first switch electrically connected between a power terminal to which power of the first external power supply device is supplied and a first node, a second switch electrically connected between the first node and a second node, a third switch electrically connected between the second node and a third node, and a fourth switch electrically connected between the third node and a ground part, and
- wherein a first end of the first capacitor is connected to the first node,
- wherein a second end of the first capacitor is connected to the third node,
- wherein the first of the first inductor is connected to the second node, and wherein the second end of the first inductor is connected to a charging terminal of the battery.

20. The electronic device of claim 19, wherein the power management module allows the first switch and the second switch to be turned on at different timings respectively by an intersection of the second band voltage and the sensing voltage, and
- wherein the power management module allows the first switch and the second switch to be turned off at different timings respectively by an intersection of the first band voltage and the sensing voltage.

\* \* \* \* \*